United States Patent
Manda et al.

(10) Patent No.: US 11,877,083 B2
(45) Date of Patent: Jan. 16, 2024

(54) SOLID-STATE IMAGING DEVICE AND ELECTRONIC APPARATUS

(71) Applicant: SONY SEMICONDUCTOR SOLUTIONS CORPORATION, Kanagawa (JP)

(72) Inventors: Shuji Manda, Kanagawa (JP); Atsushi Okuyama, Kanagawa (JP); Tomoyuki Hirano, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 297 days.

(21) Appl. No.: 17/419,124

(22) PCT Filed: Dec. 2, 2019

(86) PCT No.: PCT/JP2019/047020
§ 371 (c)(1),
(2) Date: Jun. 28, 2021

(87) PCT Pub. No.: WO2020/137370
PCT Pub. Date: Jul. 2, 2020

(65) Prior Publication Data
US 2021/0400225 A1     Dec. 23, 2021

(30) Foreign Application Priority Data

Dec. 27, 2018 (JP) ................. 2018-244508

(51) Int. Cl.
*H04N 25/77* (2023.01)
*H01L 27/146* (2006.01)
(Continued)

(52) U.S. Cl.
CPC ....... *H04N 25/77* (2023.01); *H01L 27/14612* (2013.01); *H04N 25/68* (2023.01)

(58) Field of Classification Search
CPC ........ H04N 25/77; H04N 25/68; H04N 25/76; H01L 27/14612; H01L 27/14661;
(Continued)

(56) References Cited

U.S. PATENT DOCUMENTS 10,515,988 B2 * 12/2019 Tayanaka ............... H04N 25/77
11,728,361 B2 *  8/2023 Kubo ................. H01L 27/14689
(Continued)

FOREIGN PATENT DOCUMENTS

JP    2013-098446 A    5/2013
JP    2016103541 A     6/2016
(Continued)

OTHER PUBLICATIONS

International Search report dated Feb. 25, 2020 in connection with PCT/JP2019/047020.

*Primary Examiner* — Marly S Camargo
(74) *Attorney, Agent, or Firm* — K&L Gates LLP

(57) ABSTRACT

A solid-state imaging device according to an embodiment of the present disclosure includes two or more pixels. The pixels each include a photoelectric converter, a charge holding section, and a transfer transistor. The charge holding section holds electric charge transferred from the photoelectric converter. The transfer transistor transfers electric charge from the photoelectric converter to the charge holding section. The pixels each further include a light blocking section that is disposed in a layer between the photoelectric converter and the charge holding section. The light blocking section has an opening which a vertical gate runs through. The pixels each further include a charge blocking section that blocks transfer of electric charge to the transfer transistor via a region between an edge, of the opening, closer to the charge holding section and the vertical gate.

8 Claims, 28 Drawing Sheets

(51) Int. Cl.
*H04N 25/68* (2023.01)
*H04N 25/76* (2023.01)

(58) Field of Classification Search
CPC ......... H01L 27/14614; H01L 27/14623; H01L 27/1463; H01L 27/14664; H01L 27/14641; H01L 27/14689
See application file for complete search history.

(56) References Cited

U.S. PATENT DOCUMENTS

| | | | |
|---|---|---|---|
| 2015/0002718 A1* | 1/2015 | Nomura | H04N 25/76 348/311 |
| 2015/0035028 A1 | 2/2015 | Fan | |
| 2016/0155774 A1 | 6/2016 | Hasegawa | |
| 2018/0033809 A1 | 2/2018 | Tayanaka | |
| 2023/0005982 A1* | 1/2023 | Nakamura | H01L 27/14614 |
| 2023/0261028 A1* | 8/2023 | Uchida | H01L 27/14614 |

FOREIGN PATENT DOCUMENTS

| | | |
|---|---|---|
| JP | 2016-534557 A | 11/2016 |
| WO | WO-2013065569 A1 | 5/2013 |
| WO | 2016/136486 A1 | 9/2016 |
| WO | WO-2018008614 A1 | 1/2018 |

\* cited by examiner

[FIG. 1]
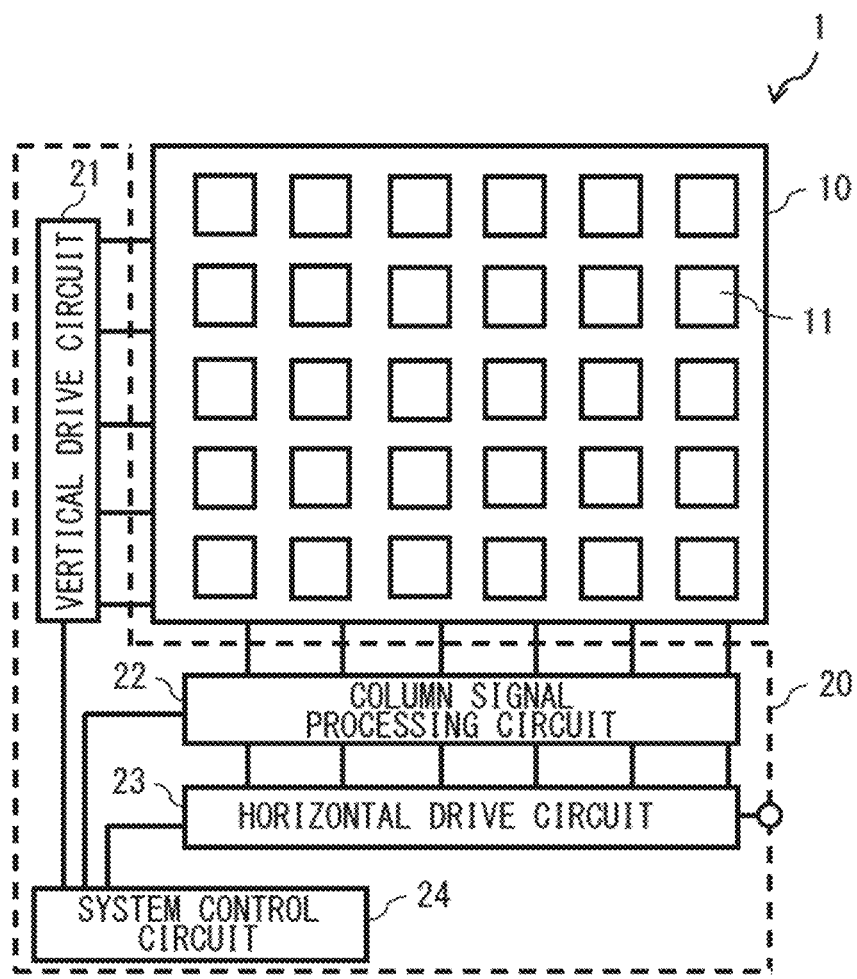

[FIG. 2]
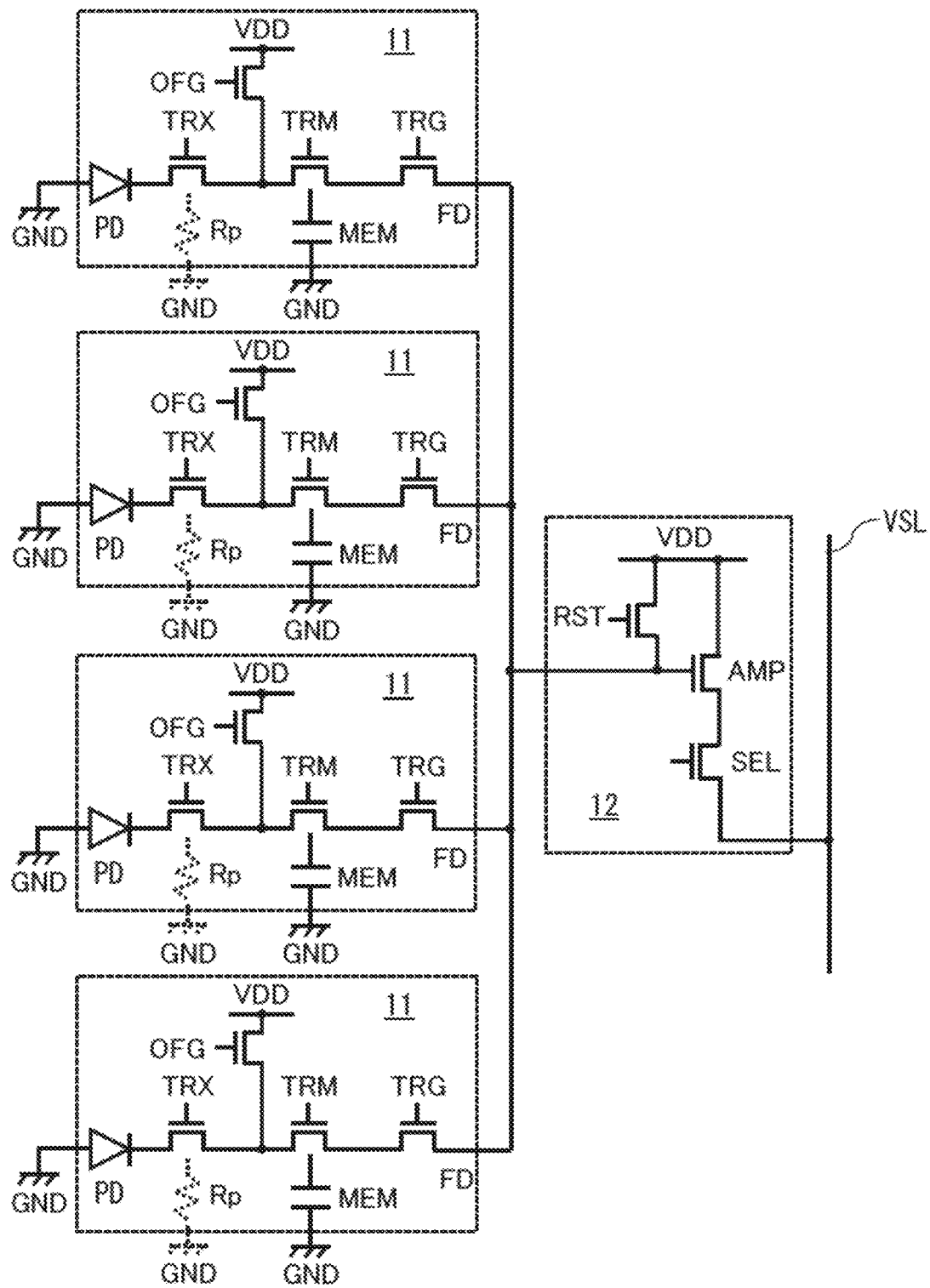

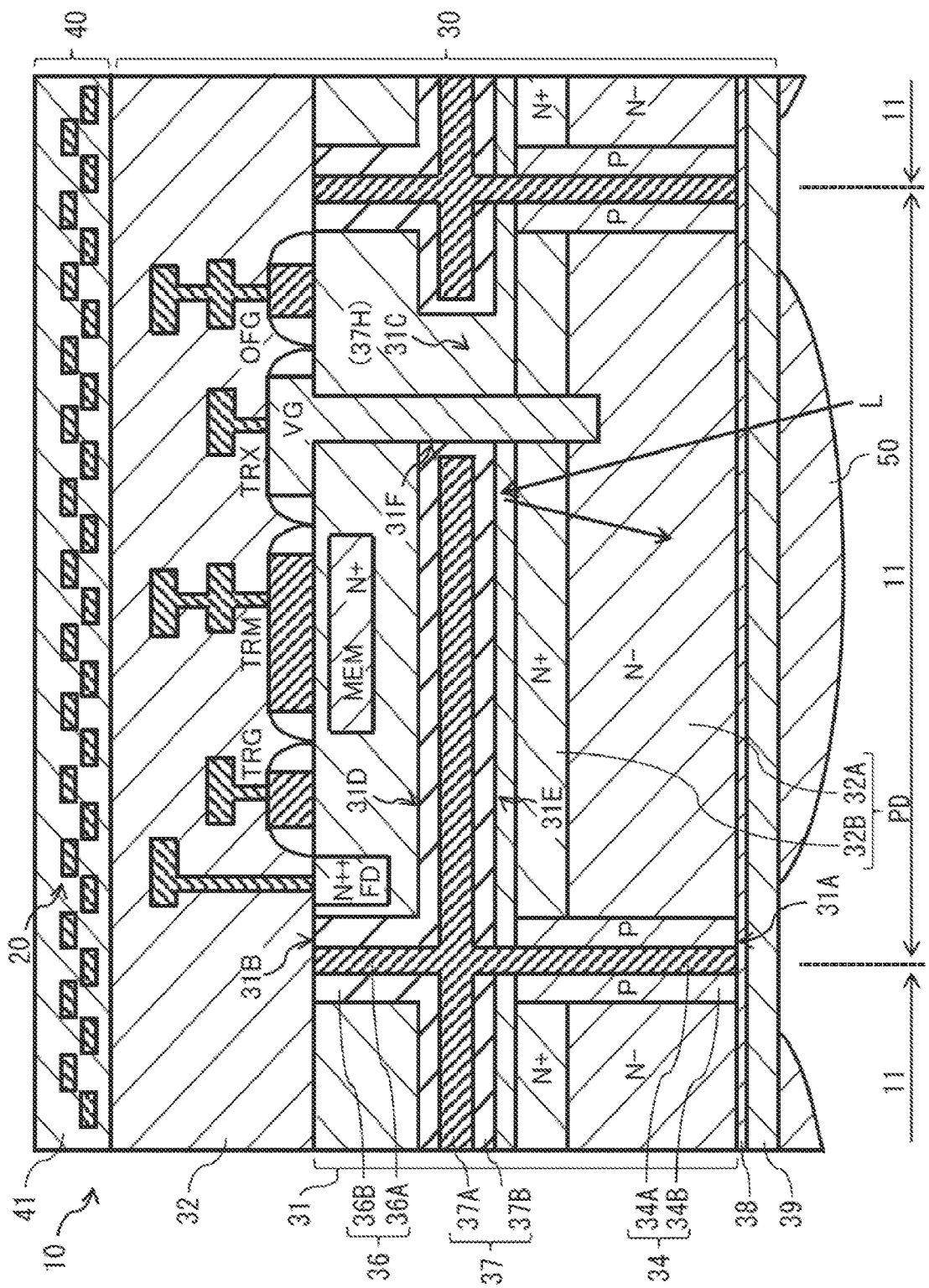
[FIG. 3]

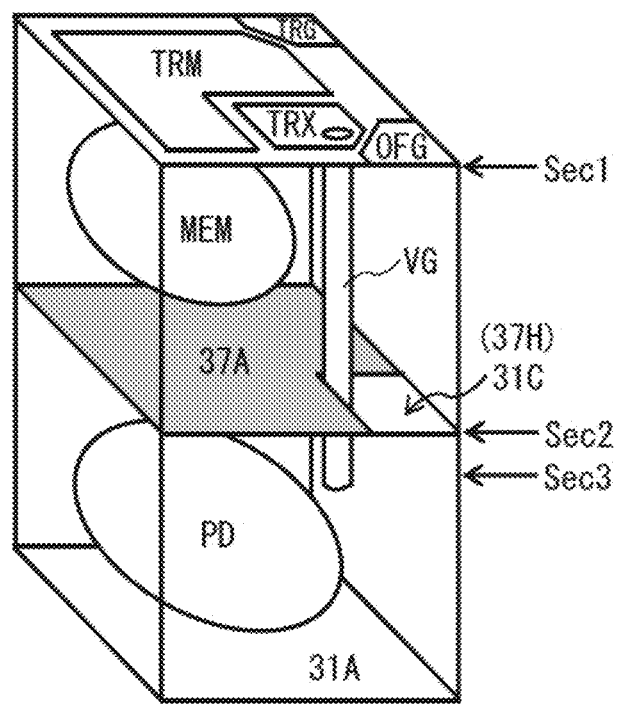
[FIG. 4]

[FIG. 5]
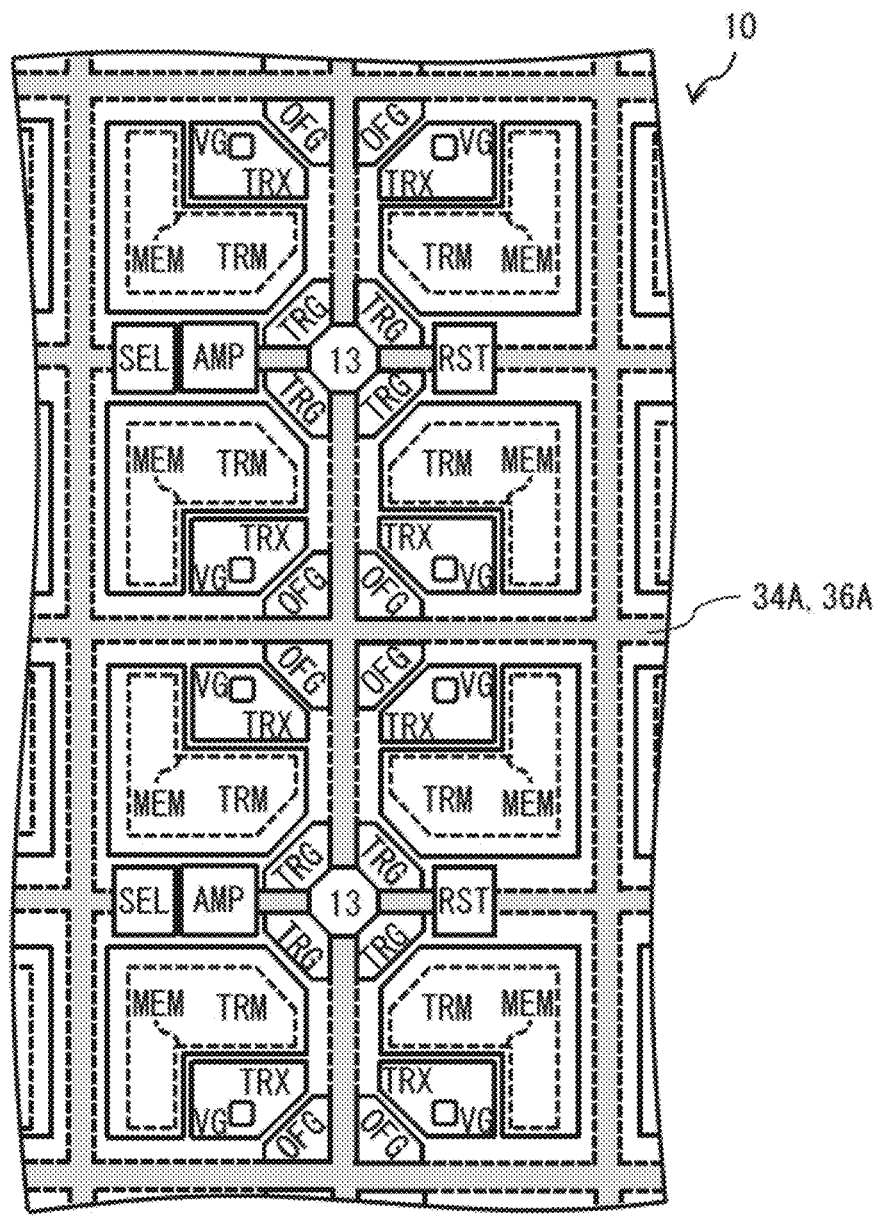

[FIG. 6]
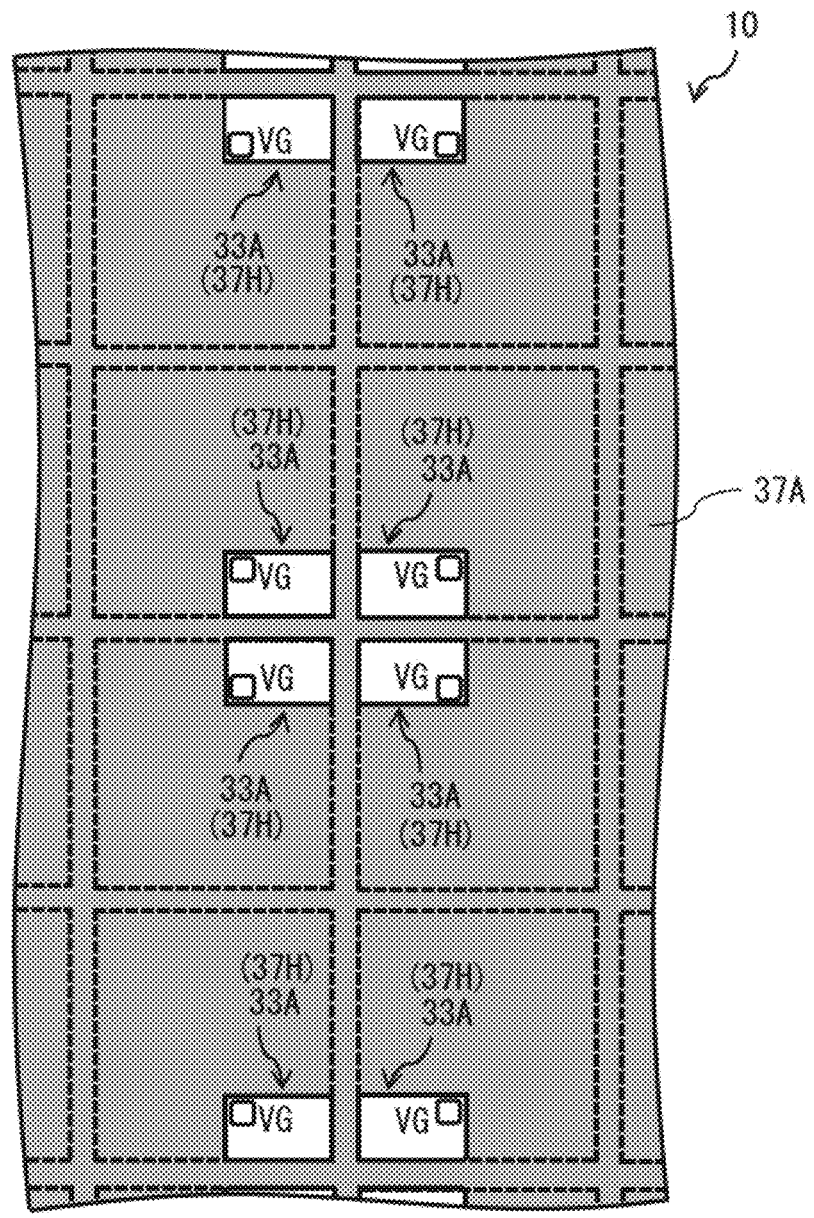

[FIG. 7]
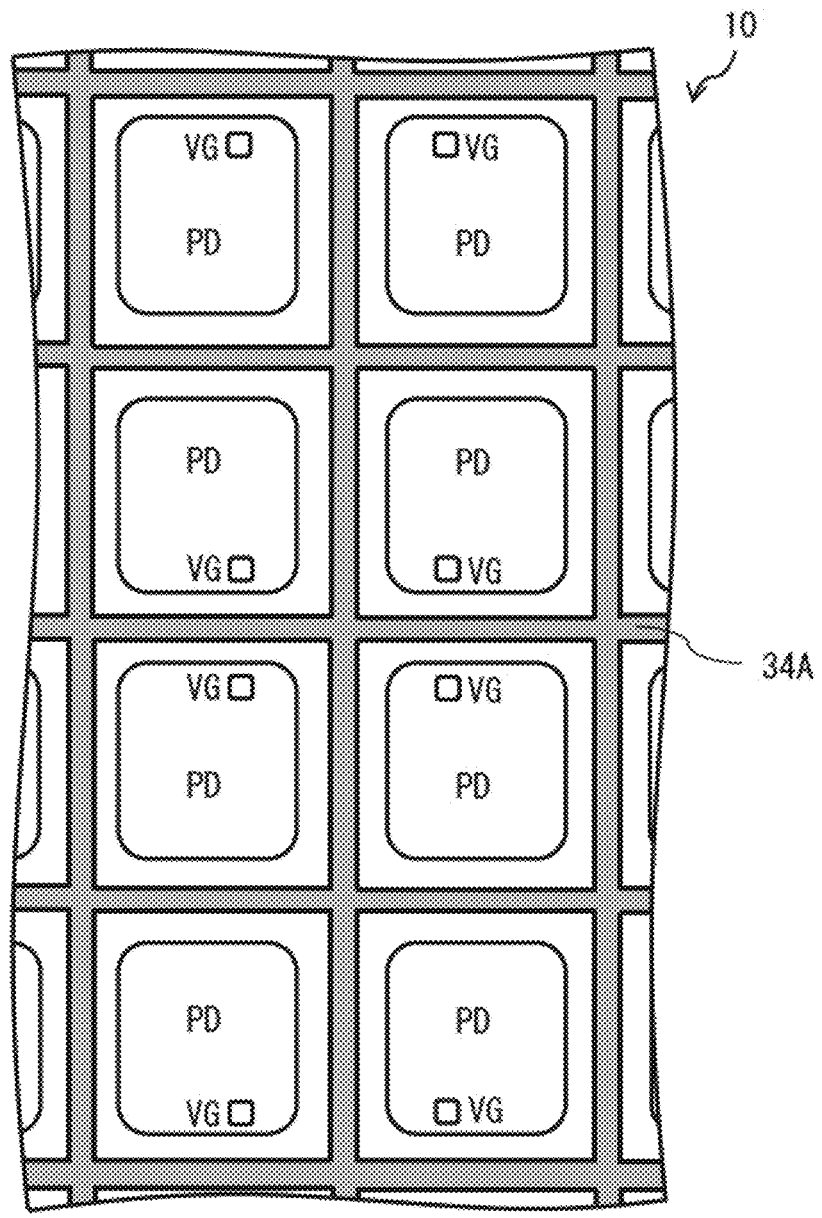

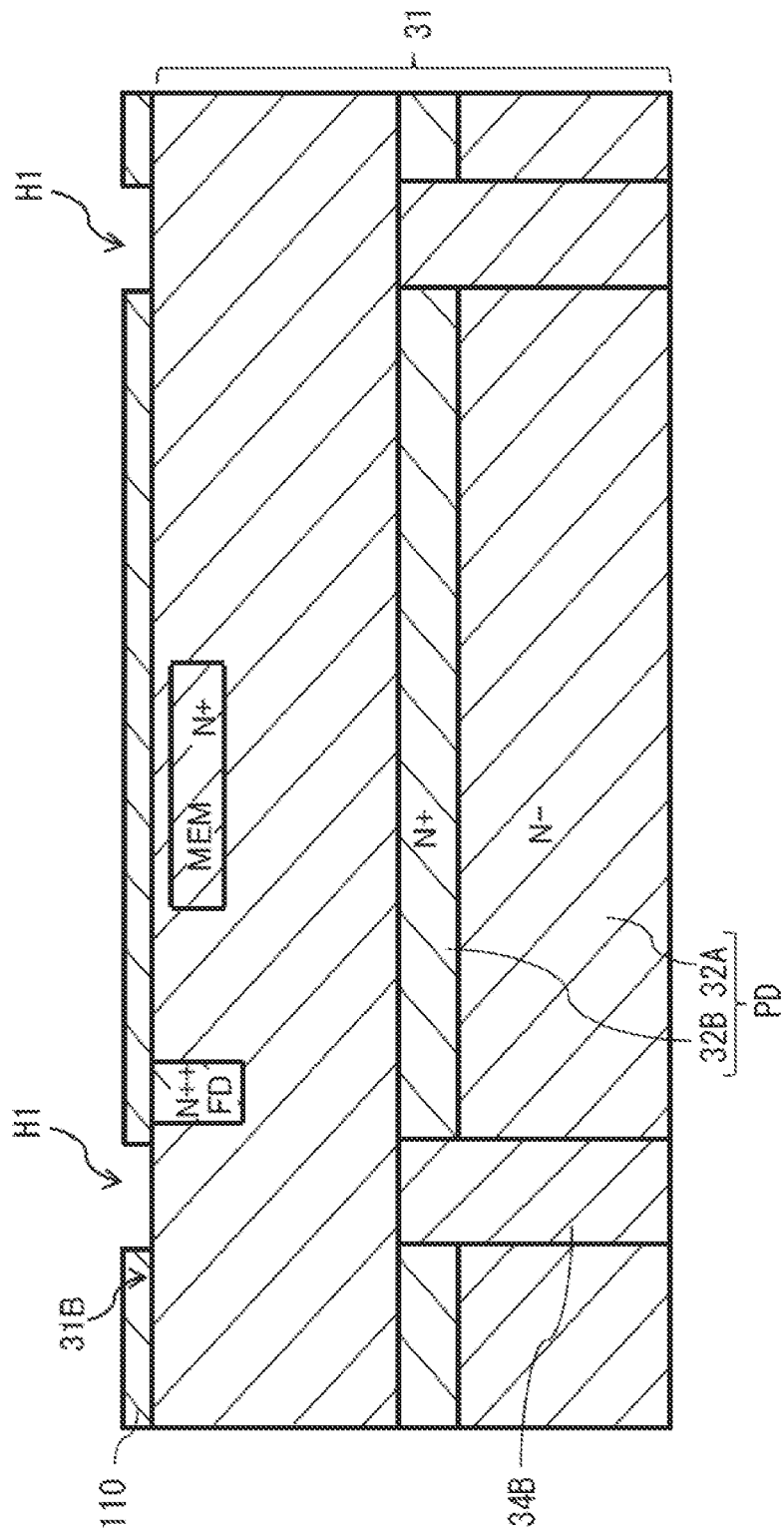

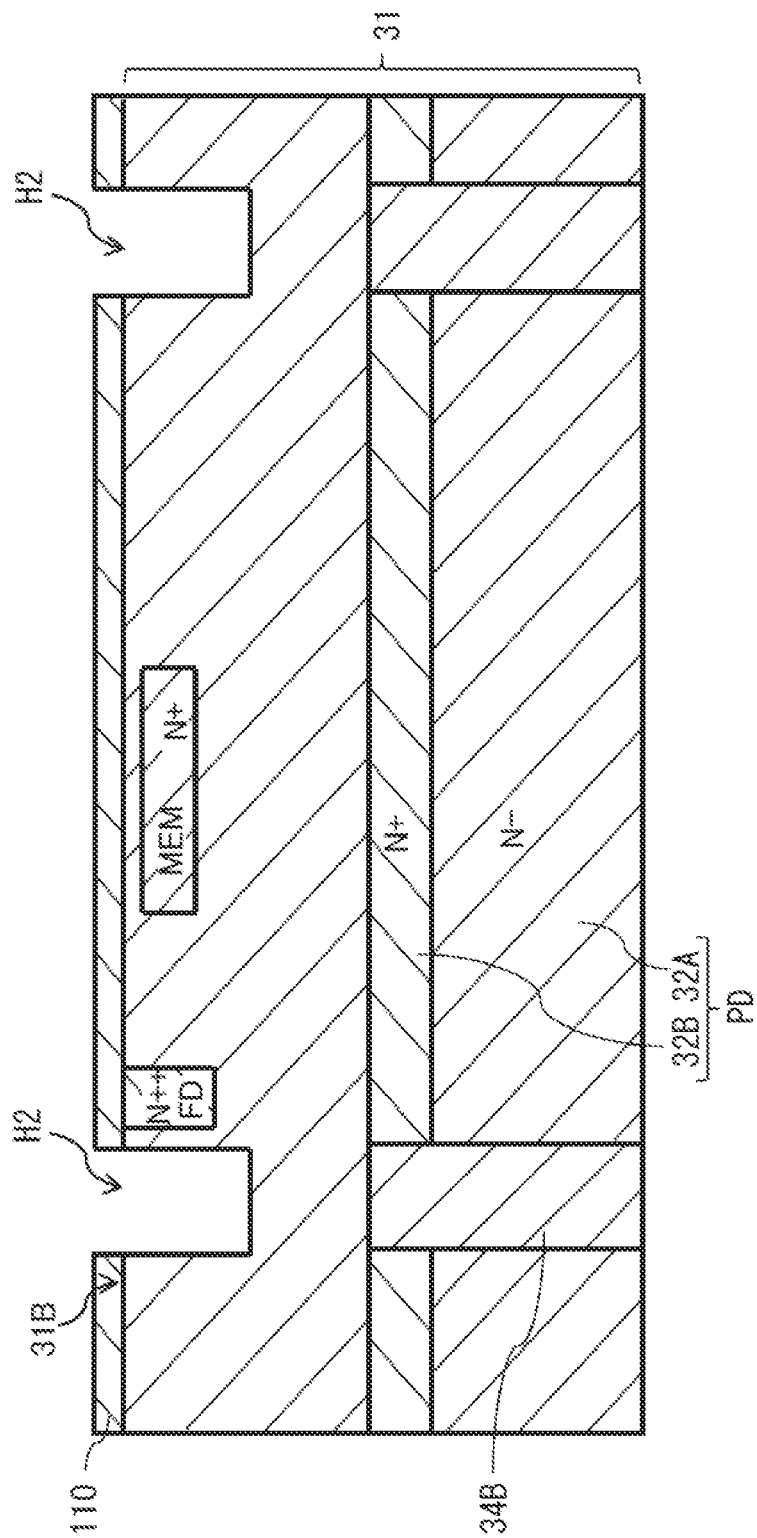

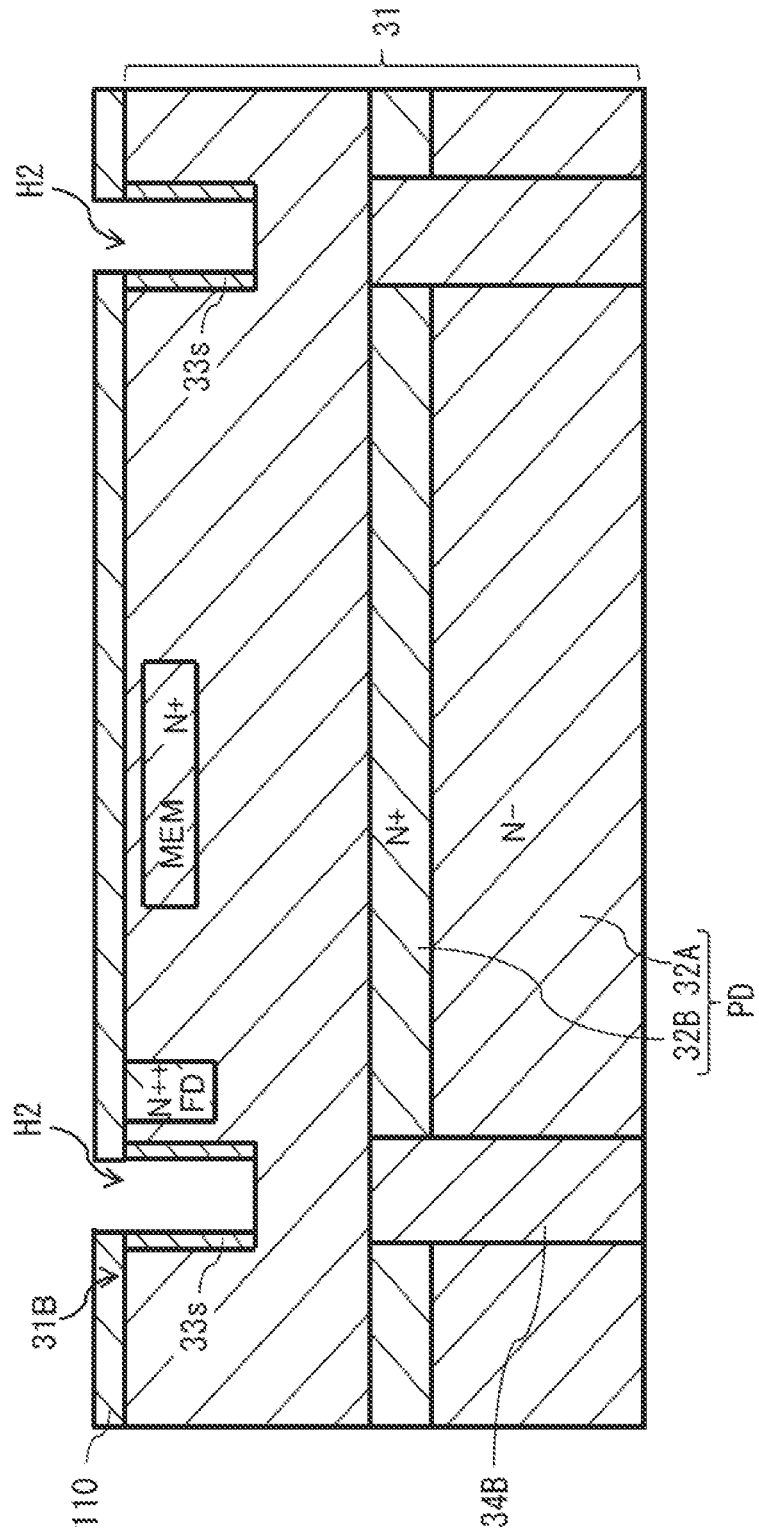
[FIG. 8C]

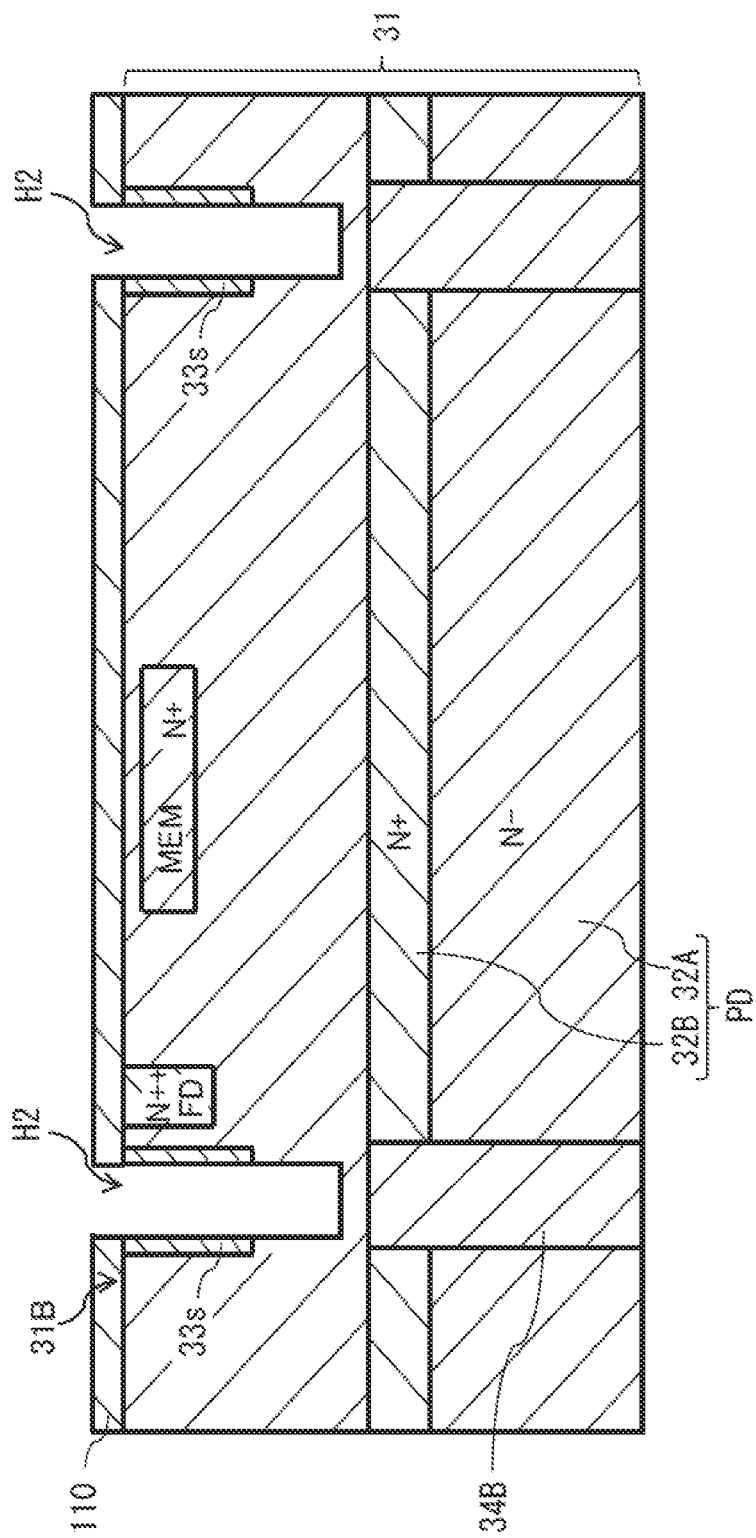
[FIG. 8D]

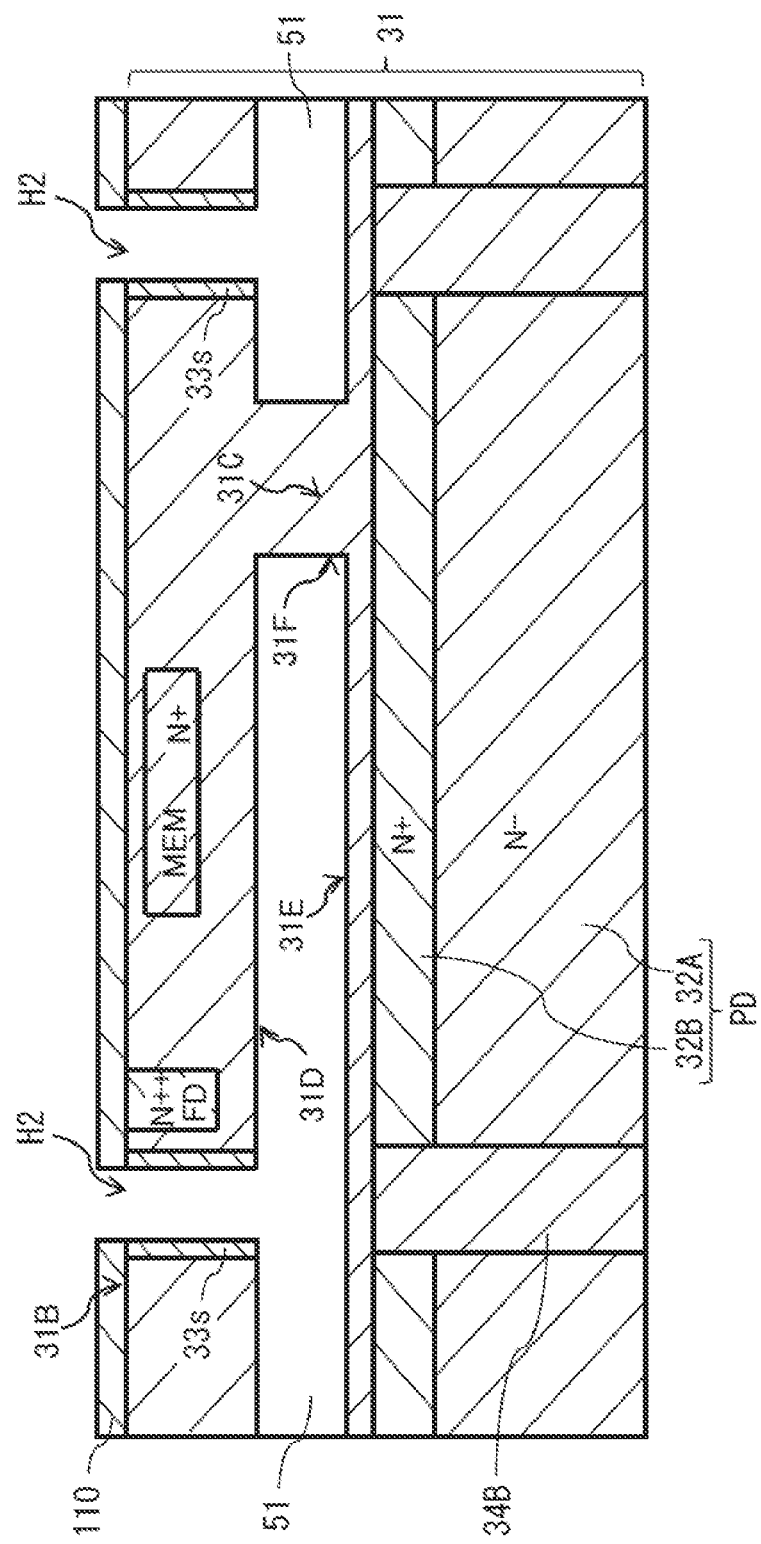
[FIG. 8E]

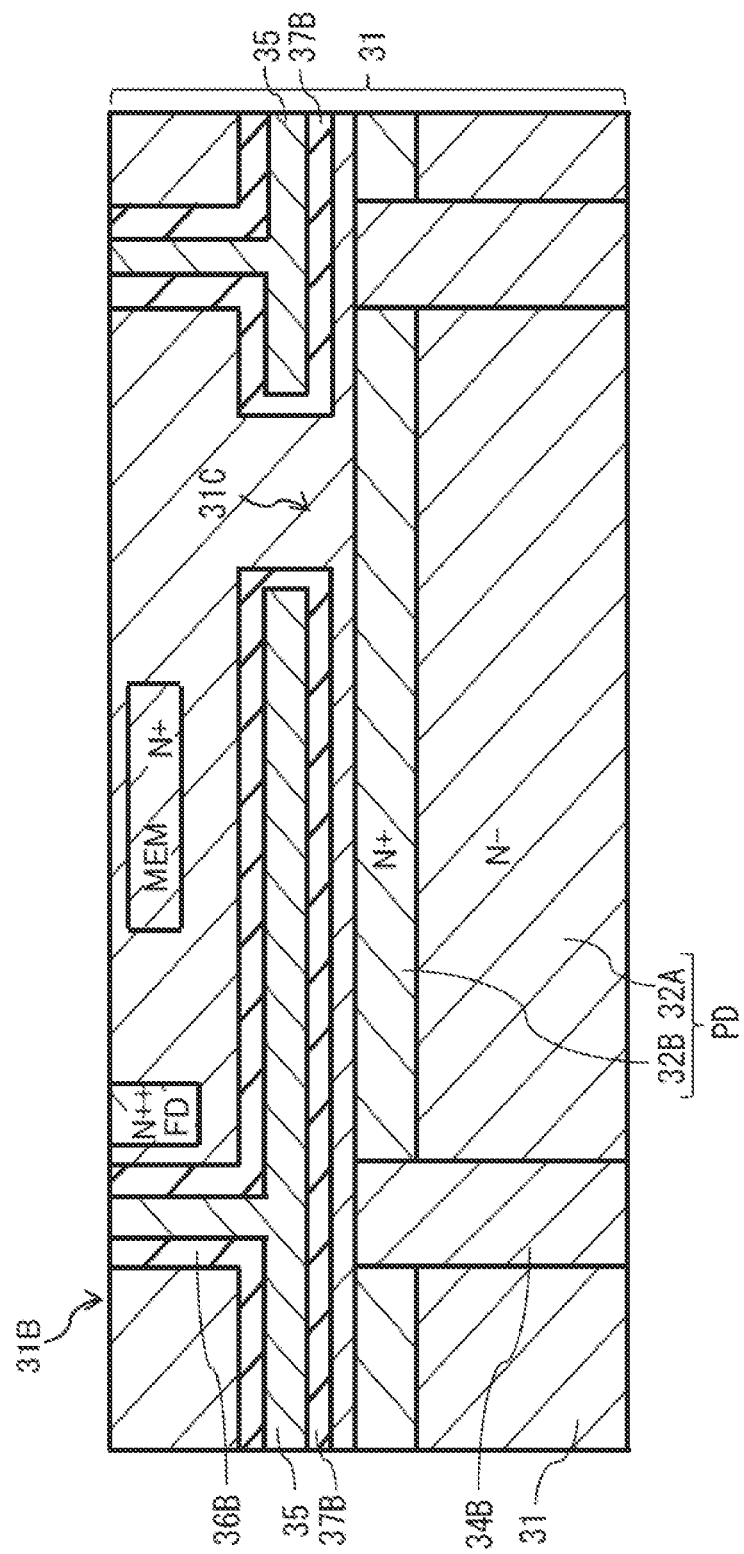
[FIG. 8F]

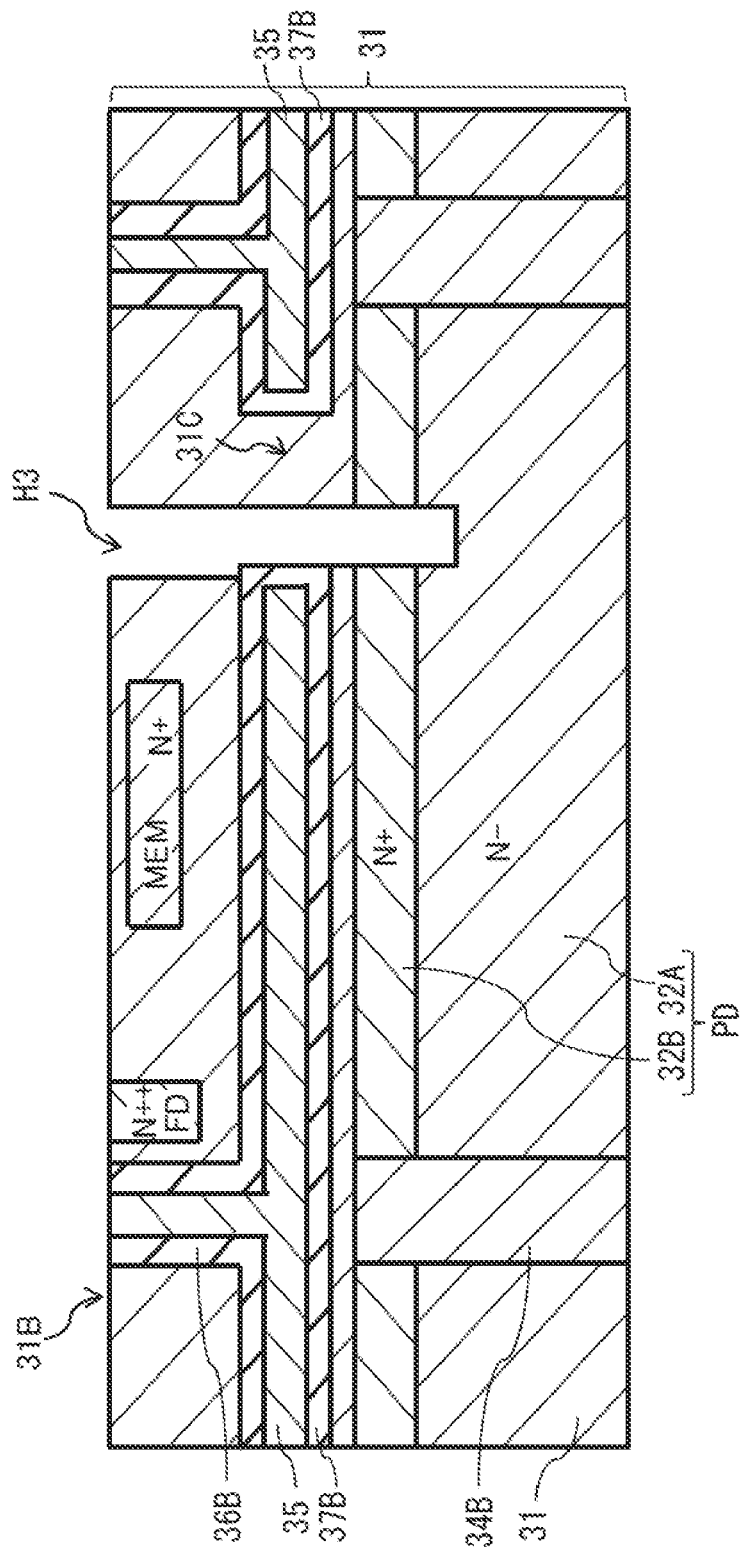
[FIG. 8G]

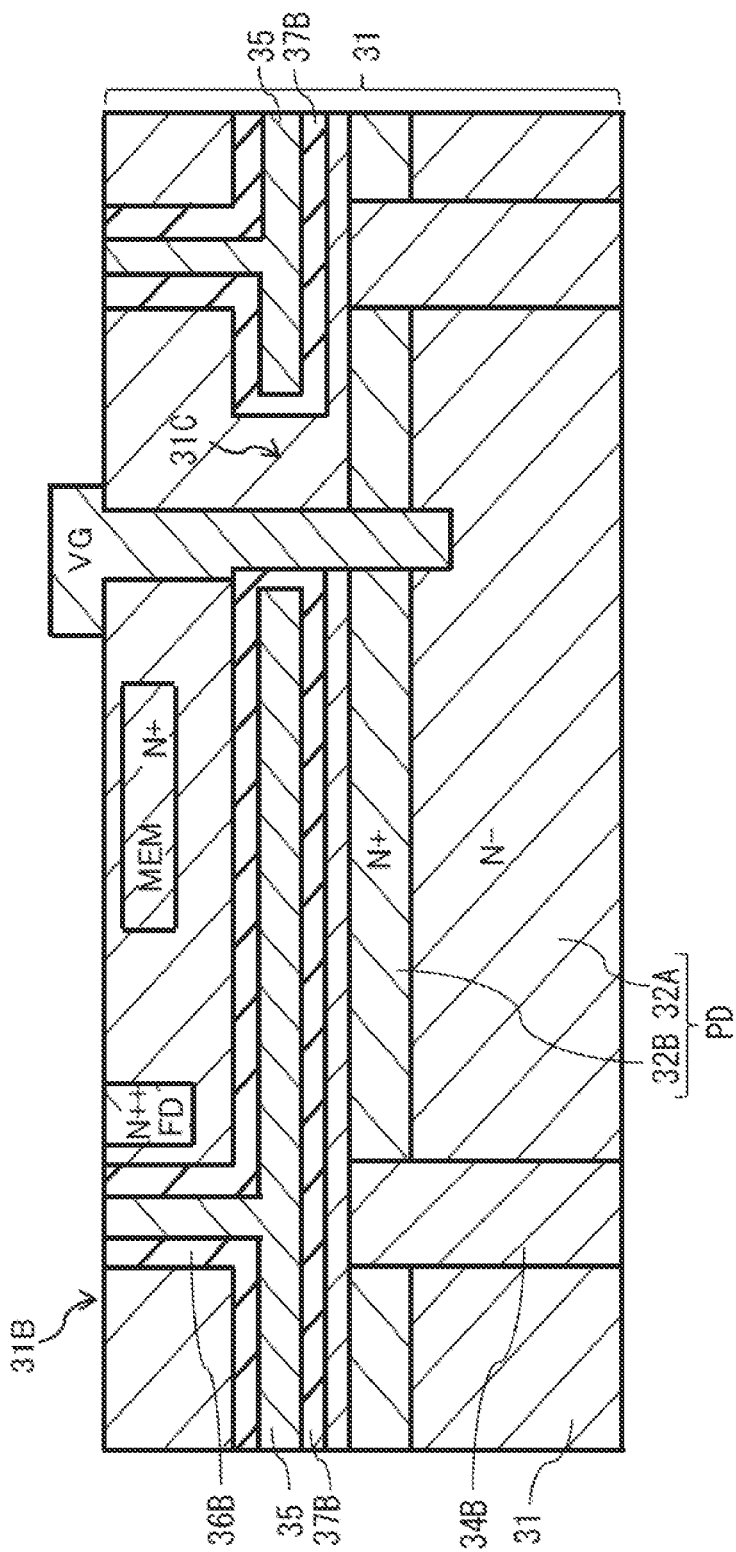
[FIG. 8H]

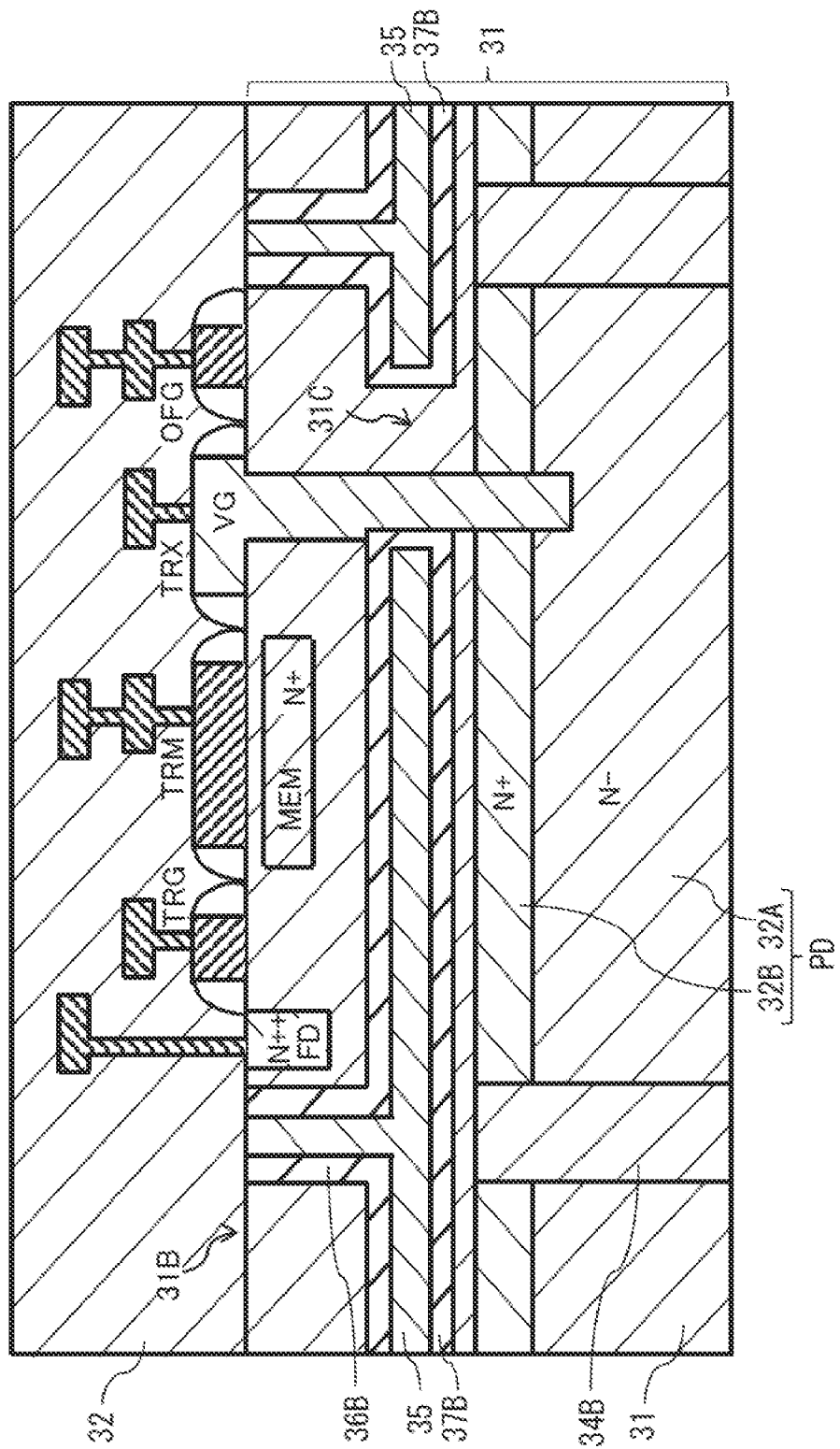
[FIG. 8I]

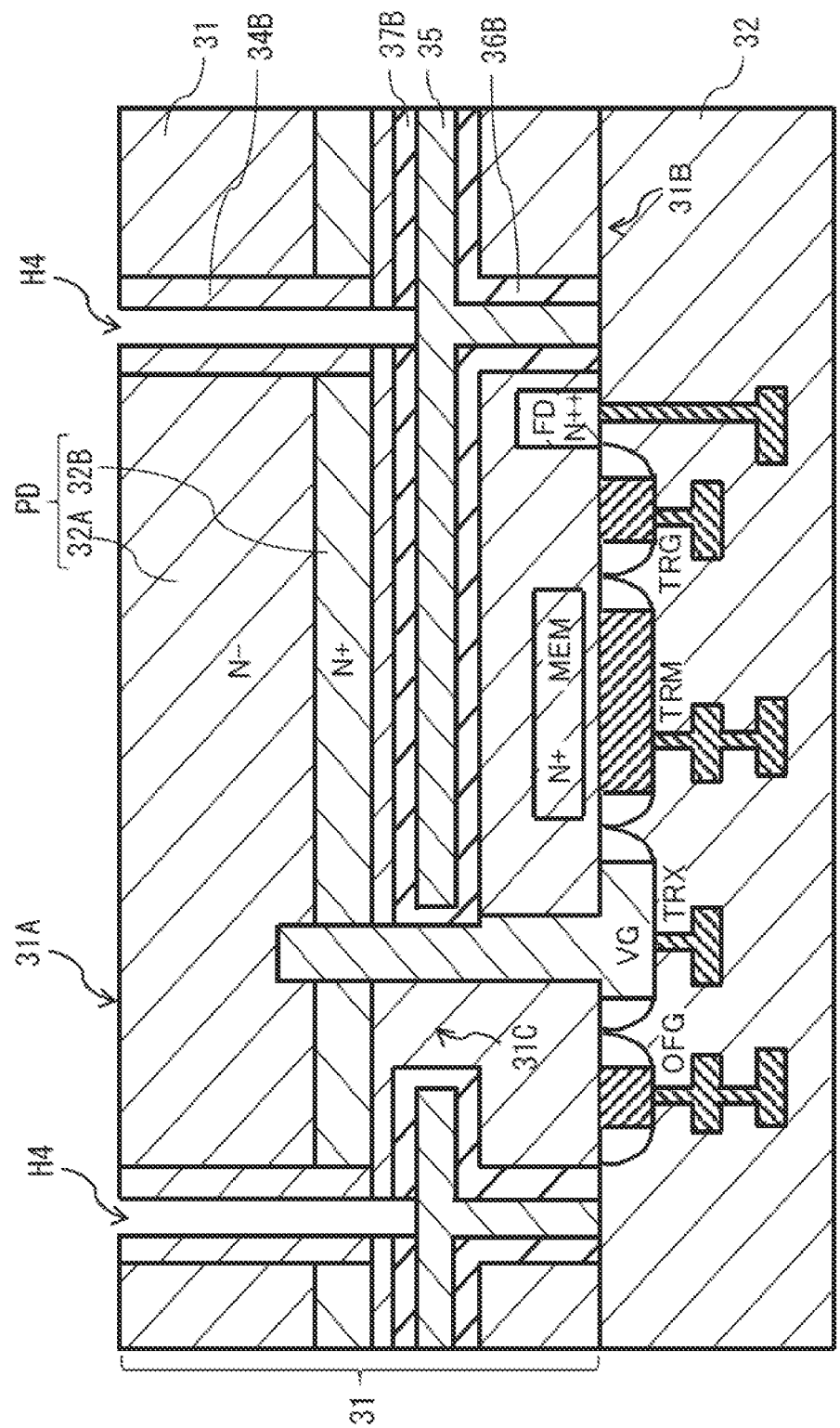

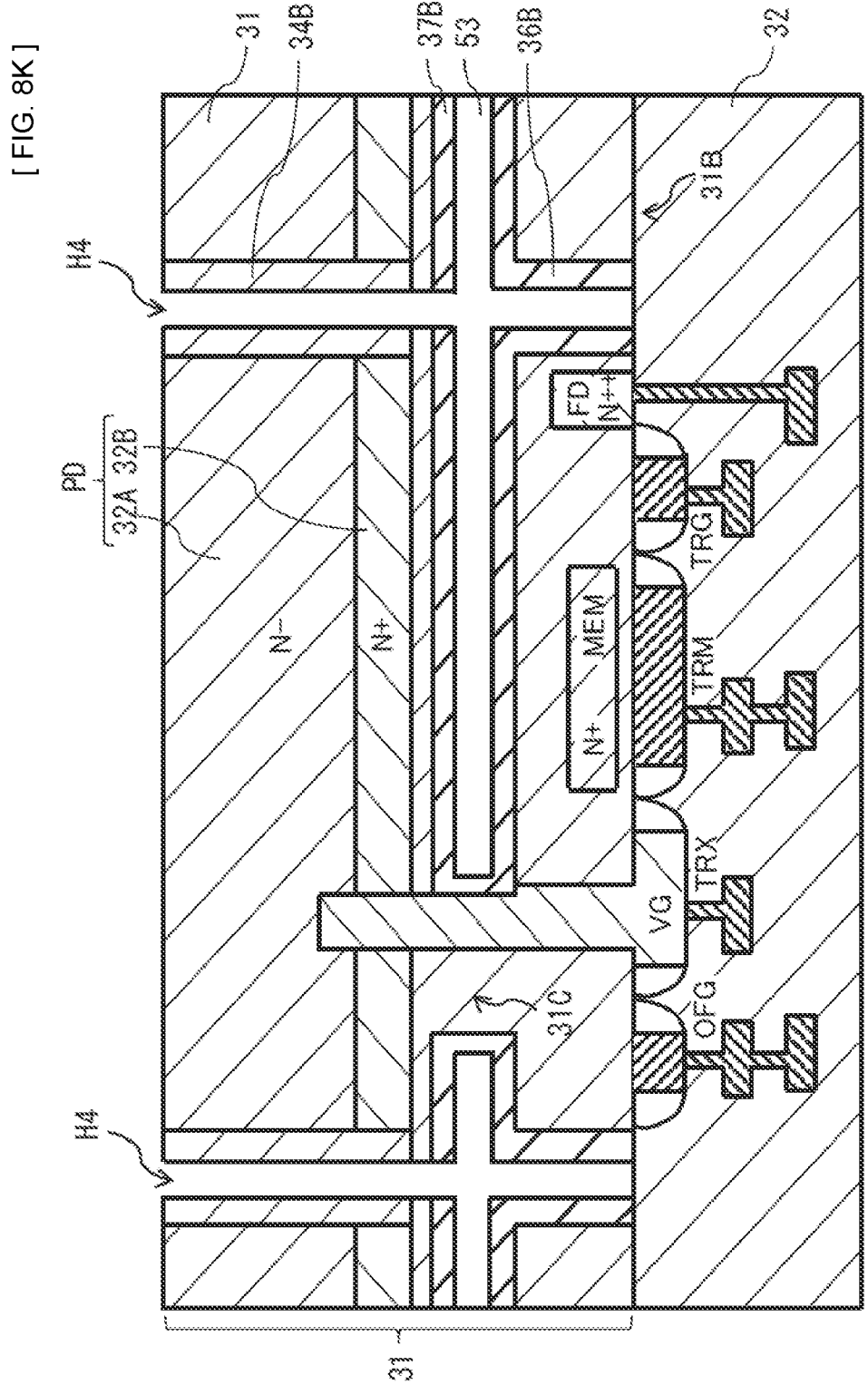
[FIG. 8K]

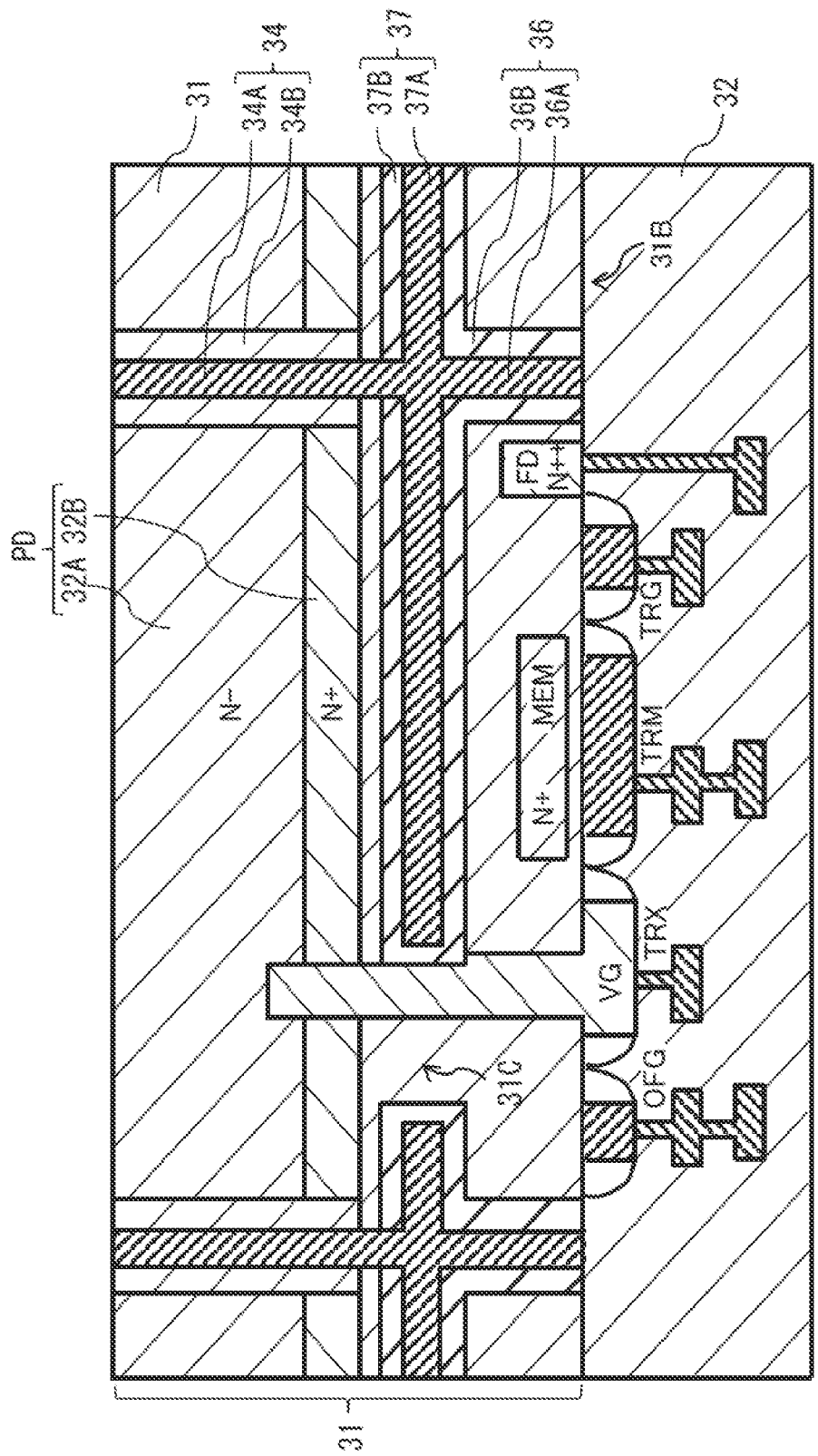

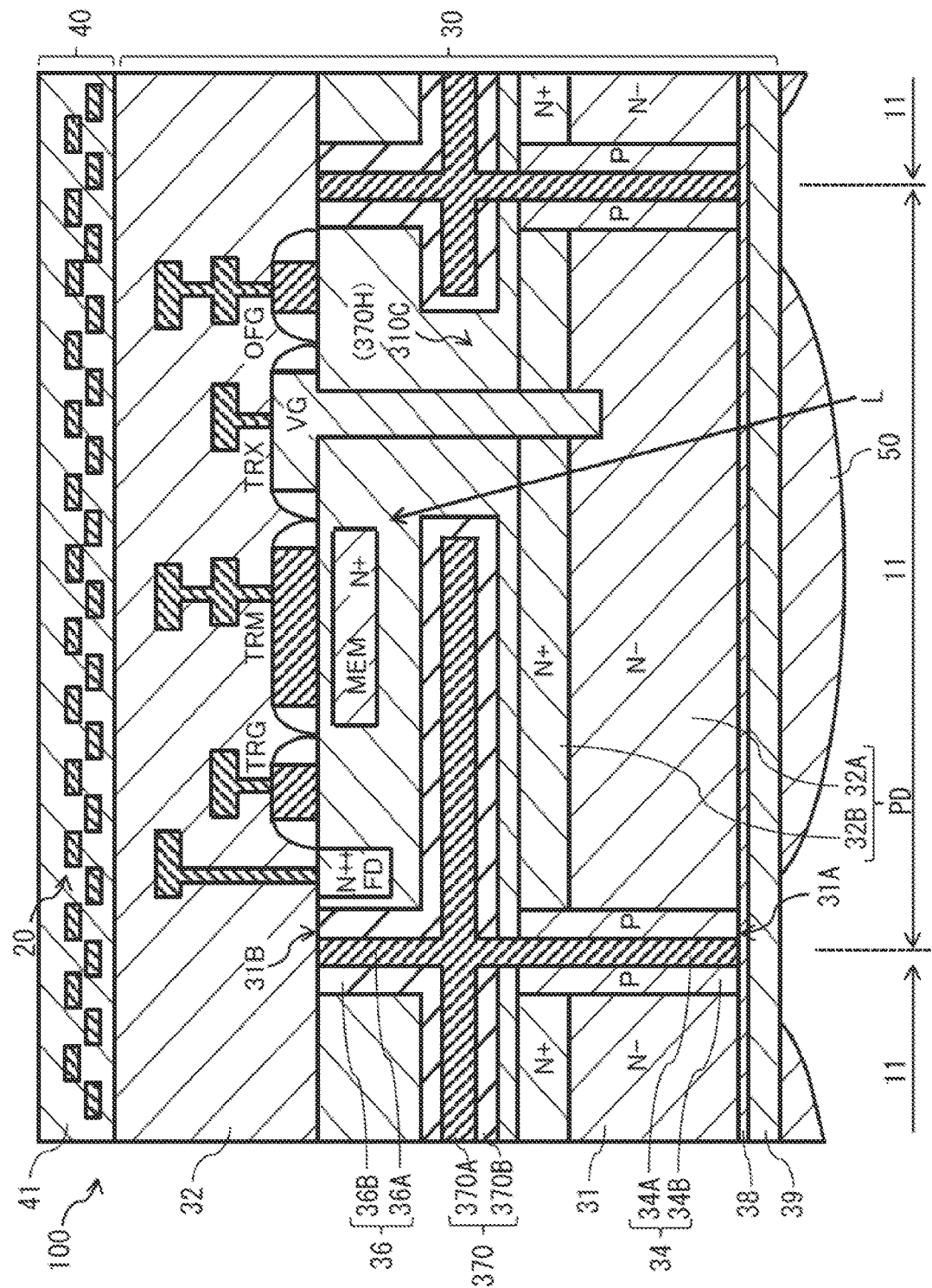

[FIG. 10]
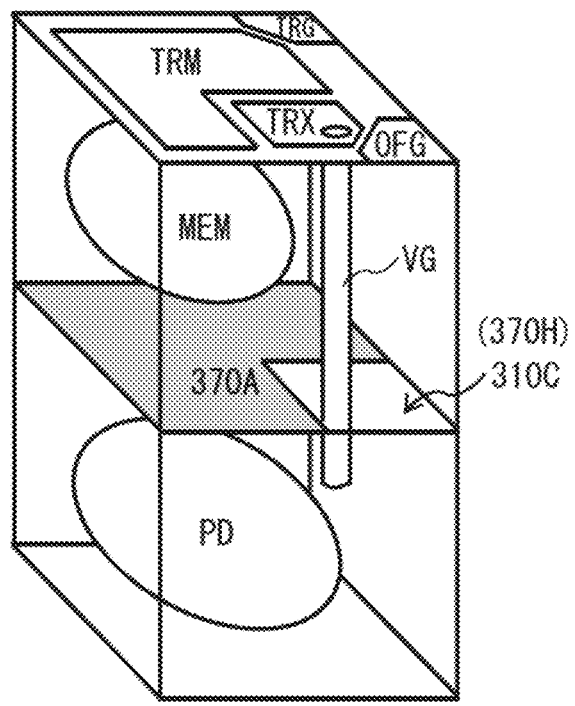

[FIG. 11]
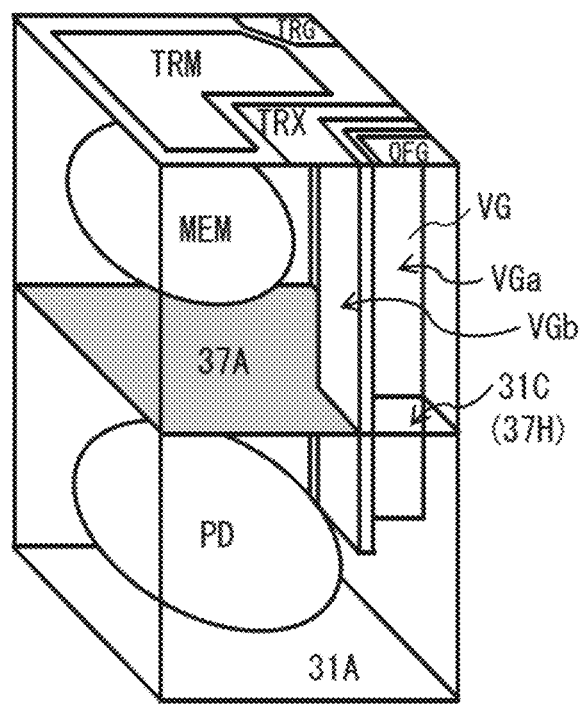

[FIG. 12]
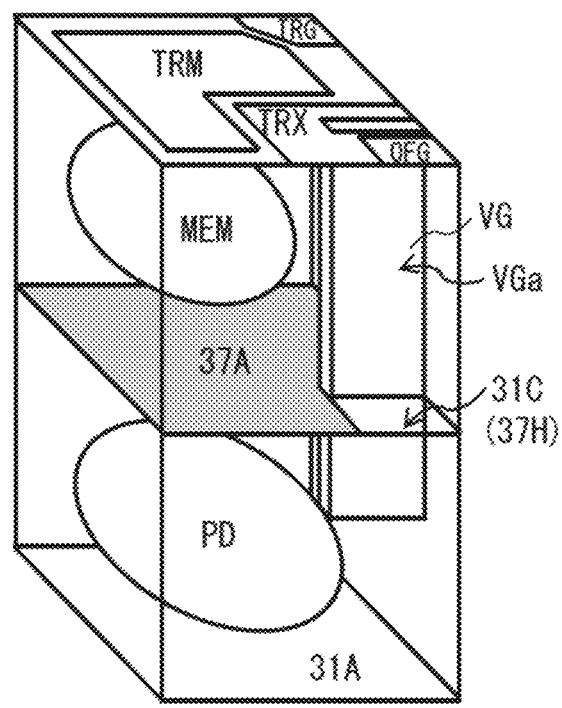

[ FIG. 13 ]
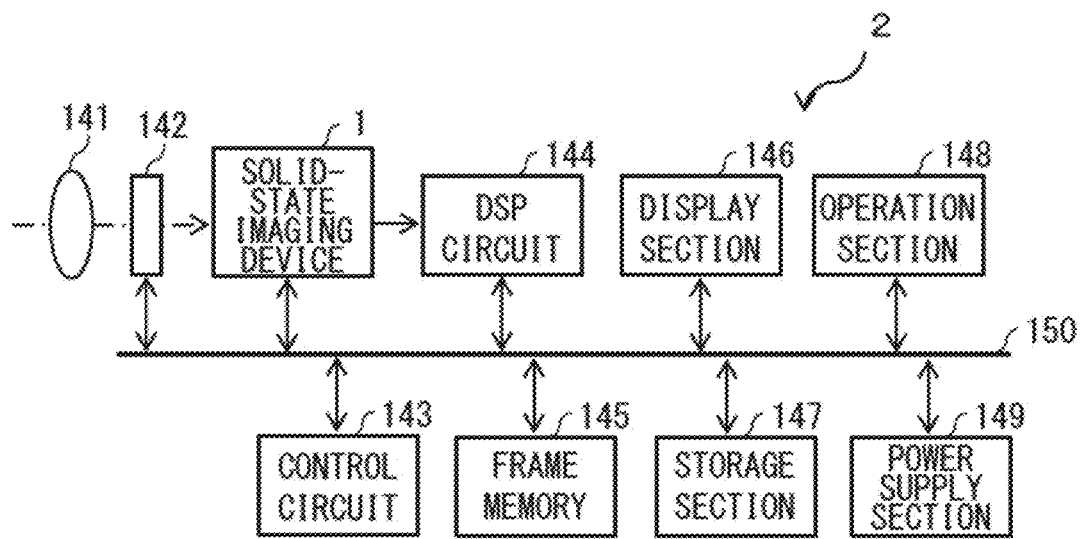
[ FIG. 14 ]
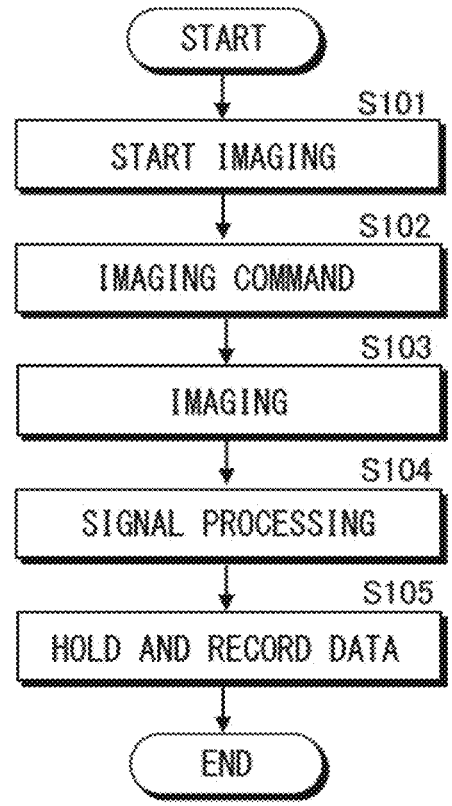

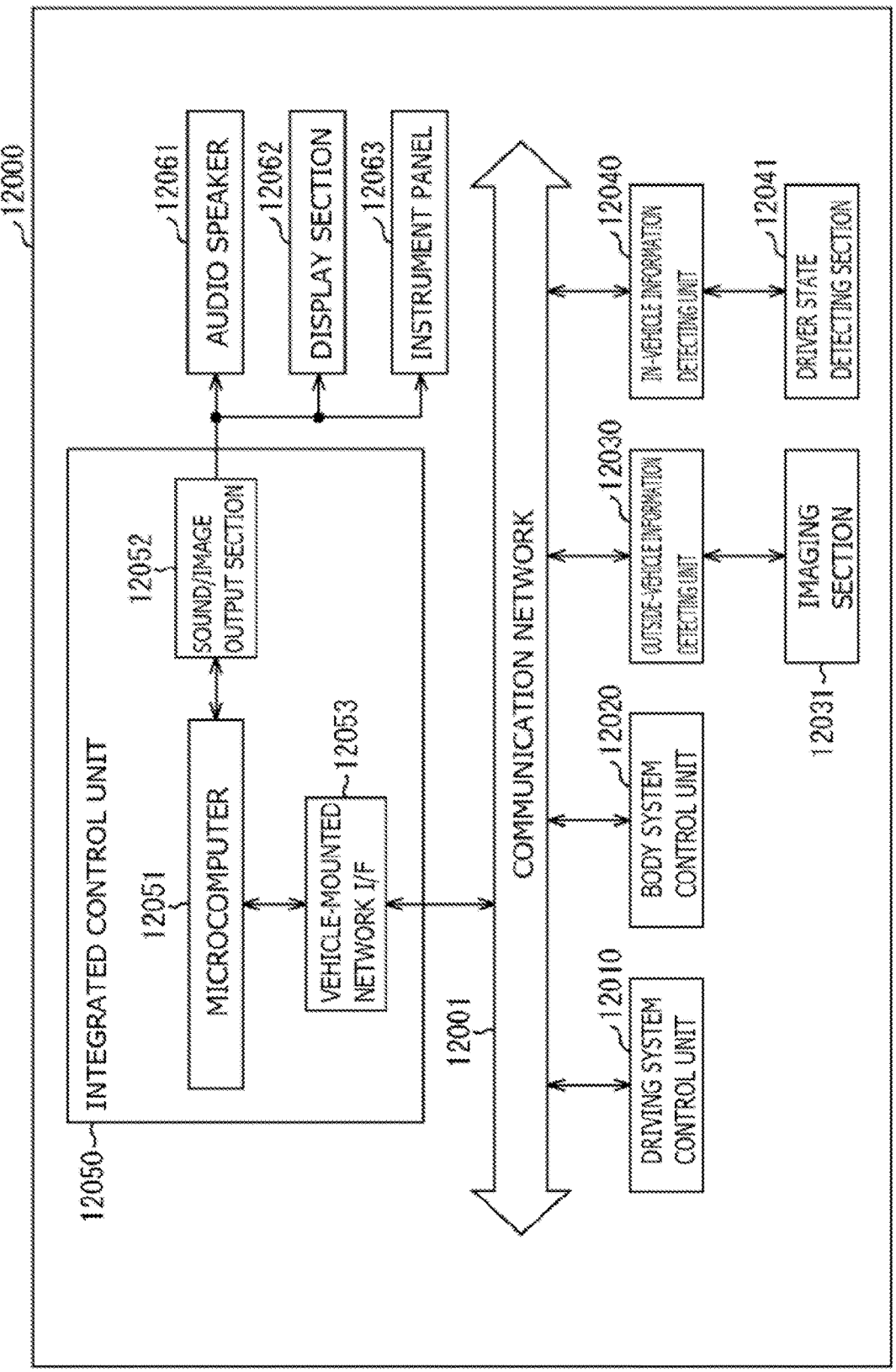

[FIG. 16]
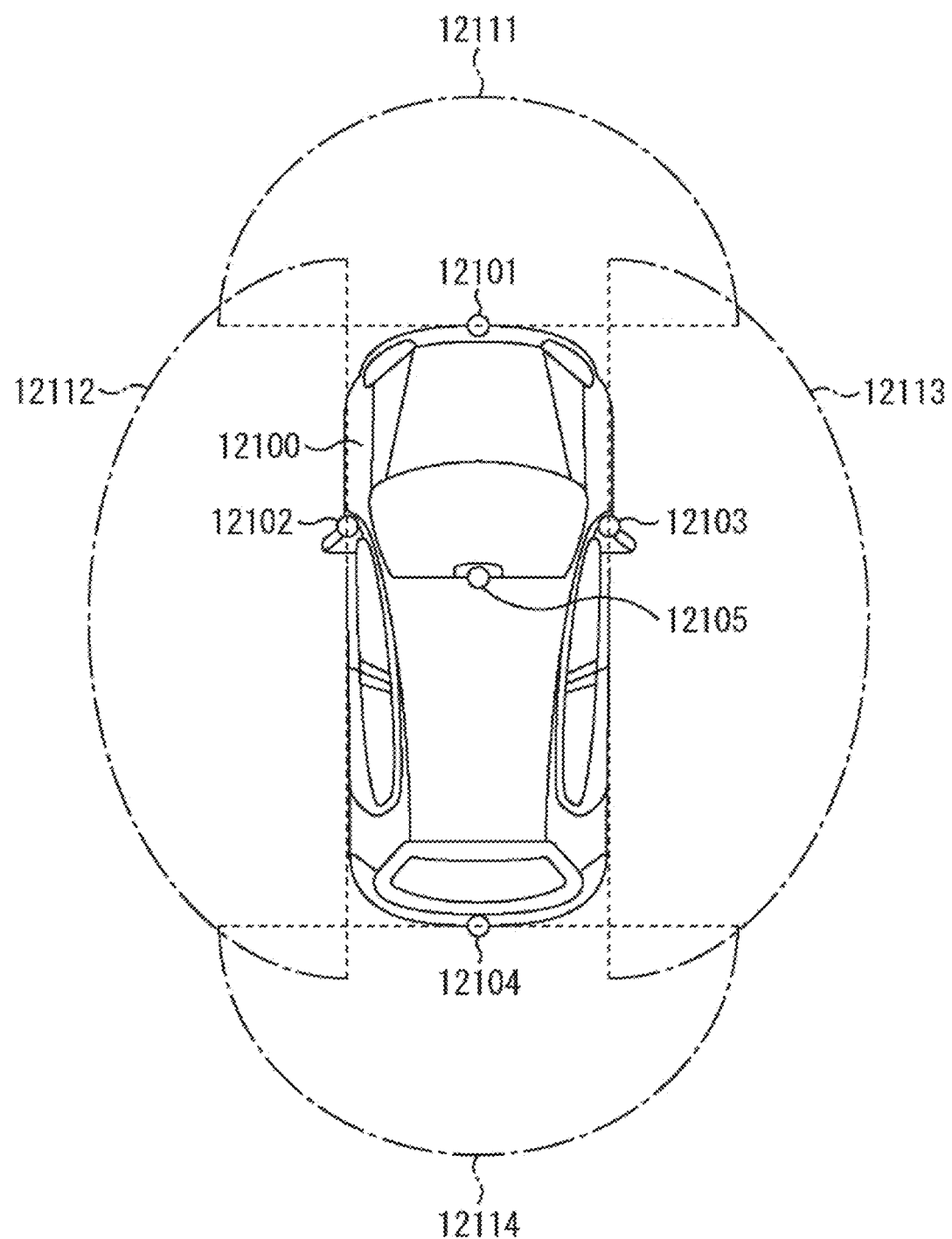

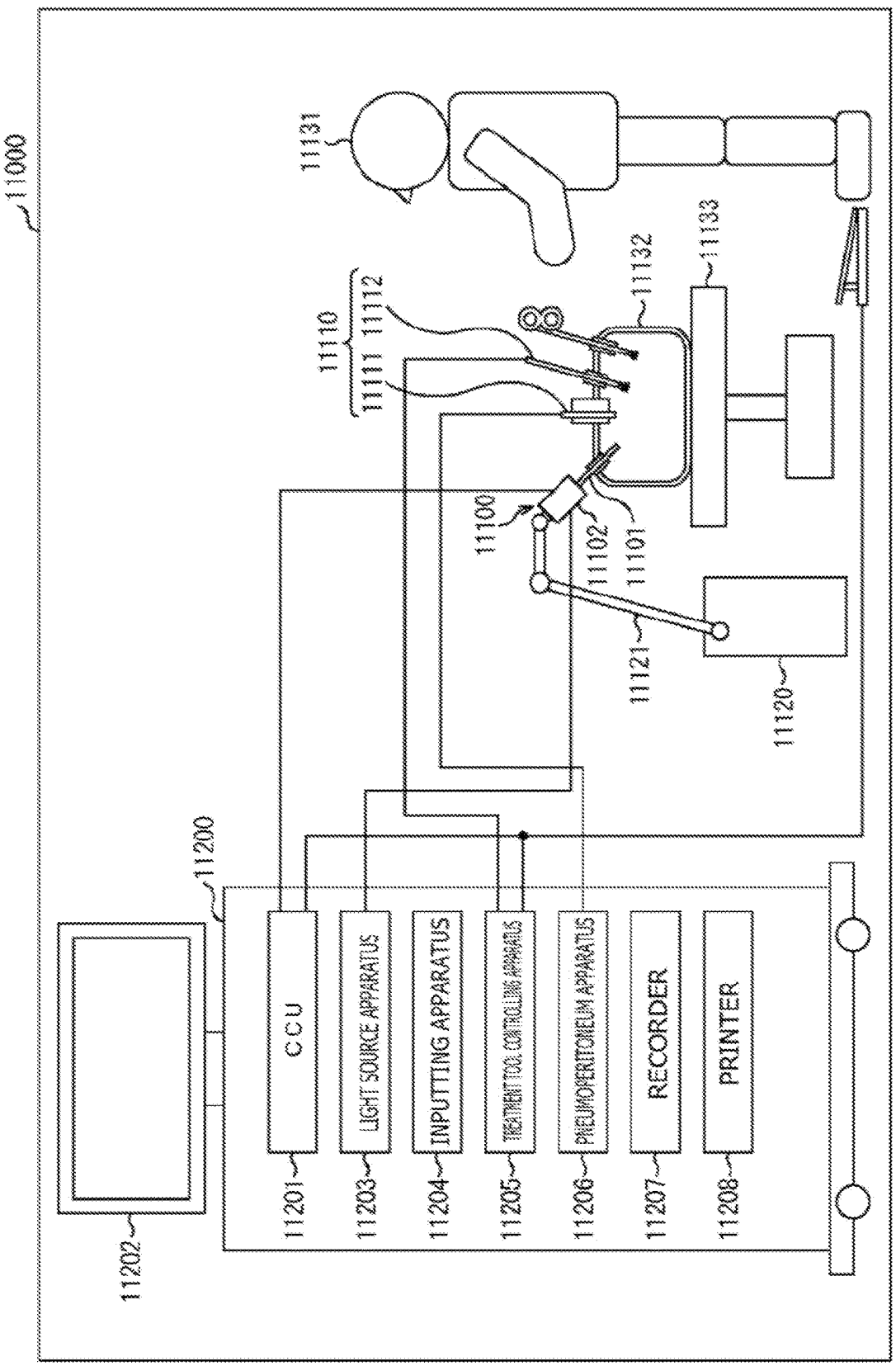

[FIG. 18]
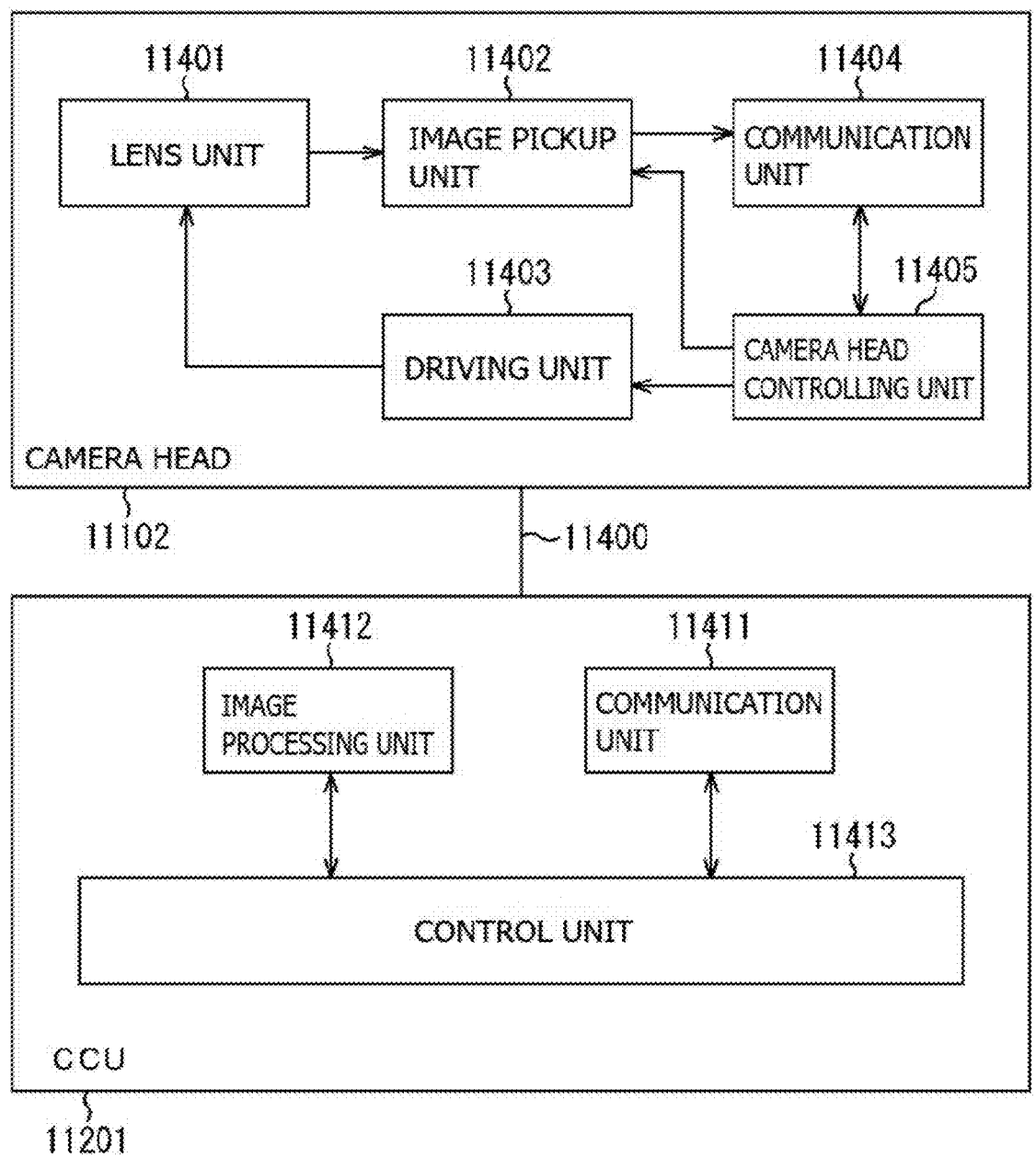

ical Field

SOLID-STATE IMAGING DEVICE AND ELECTRONIC APPARATUS

TECHNICAL FIELD

The present disclosure relates to a solid-state imaging device and an electronic apparatus.

BACKGROUND ART

For a solid-state imaging device, it has been proposed to provide a light blocking section between a photoelectric converter and a charge holding section in order to prevent light, from a light receiving surface, from entering the charge holding section to which electric charge accumulated in the photoelectric converter is to be transferred (for example, see PTL 1).

CITATION LIST

Patent Literature

PTL 1: International Publication No. WO 2016/136486

SUMMARY OF THE INVENTION

Incidentally, in the field of the solid-state imaging device described above, it is desired to reduce noise due to entry of light into the charge holding section. Therefore, it is desirable to provide: a solid-state imaging device that is able to reduce noise due to entry of light into a charge holding section; and an electronic apparatus including the same.

A solid-state imaging device according to an embodiment of the present disclosure includes a light receiving surface and two or more pixels that oppose the light receiving surface. The pixels each include a photoelectric converter, a charge holding section, and a transfer transistor. The photoelectric converter performs photoelectric conversion on light entering via the light receiving surface. The charge holding section holds electric charge transferred from the photoelectric converter. The transfer transistor includes a vertical gate electrode reaching the photoelectric converter, and transfers electric charge from the photoelectric converter to the charge holding section. The pixels each further include a light blocking section and a charge blocking section. The light blocking section is disposed in a layer between the photoelectric converter and the charge holding section. The light blocking section has an opening which the vertical gate electrode runs through, and blocks entry, into the charge holding section, of light entering via the light receiving surface at a part other than the opening. The charge blocking section blocks transfer of electric charge to the transfer transistor via a region between an edge, of the opening, closer to the charge holding section and the vertical gate electrode.

An electronic apparatus according to an embodiment of the present disclosure includes a solid-state imaging device and a signal processing circuit. The solid-state imaging device outputs a pixel signal based on entering light. The signal processing circuit processes the pixel signal. The solid-state imaging device included in the electronic apparatus has the same configuration as the solid-state imaging device described above.

In the solid-state imaging device and the electronic apparatus according to the embodiments of the present disclosure, the charge blocking section blocks transfer of electric charge to the transfer transistor via a region between the edge, of the opening of the light blocking section, closer to the charge holding section and the vertical gate electrode. This makes it possible to reduce entry of light into the charge holding section, as compared with a case where no charge blocking section is provided at the opening of the light blocking section.

BRIEF DESCRIPTION OF DRAWINGS

FIG. 1 is a diagram illustrating an example of a schematic configuration of a solid-state imaging device according to an embodiment of the present disclosure.

FIG. 2 is a diagram illustrating an example of a circuit configuration of sensor pixels in FIG. 1.

FIG. 3 is a diagram illustrating an example of a cross-sectional configuration of the sensor pixels in FIG. 1.

FIG. 4 is a perspective view of an example of a schematic configuration of the sensor pixel in FIG. 1.

FIG. 5 is a diagram illustrating an example of a planar configuration at Sec1 in FIG. 4.

FIG. 6 is a diagram illustrating an example of a planar configuration at Sec2 in FIG. 4.

FIG. 7 is a diagram illustrating an example of a planar configuration at Sec3 in FIG. 4.

FIG. 8A is a diagram illustrating an example of a method of manufacturing the solid-state imaging device in FIG. 1.

FIG. 8B is a diagram for describing a manufacturing process following FIG. 8A.

FIG. 8C is a diagram for describing a manufacturing process following FIG. 8B.

FIG. 8D is a diagram for describing a manufacturing process following FIG. 8C.

FIG. 8E is a diagram for describing a manufacturing process following FIG. 8D.

FIG. 8F is a diagram for describing a manufacturing process following FIG. 8E.

FIG. 8G is a diagram for describing a manufacturing process following FIG. 8F.

FIG. 8H is a diagram for describing a manufacturing process following FIG. 8G.

FIG. 8I is a diagram for describing a manufacturing process following FIG. 8H.

FIG. 8J is a diagram for describing a manufacturing process following FIG. 8I.

FIG. 8K is a diagram for describing a manufacturing process following FIG. 8J.

FIG. 8L is a diagram for describing a manufacturing process following FIG. 8K.

FIG. 9 is a diagram illustrating an example of a cross-sectional configuration of sensor pixels of a solid-state imaging device according to a comparative example.

FIG. 10 is a perspective view of an example of a schematic configuration of the sensor pixel in FIG. 9.

FIG. 11 is a perspective view of a modification of the schematic configuration of the sensor pixel in FIG. 4.

FIG. 12 is a perspective view of a modification of the schematic configuration of the sensor pixel in FIG. 4.

FIG. 13 is a diagram illustrating an example of a schematic configuration of an imaging system including an imaging device according to any of the embodiment and the modifications thereof described above.

FIG. 14 is a diagram illustrating an example of an imaging process of the imaging system in FIG. 13.

FIG. 15 is a block diagram depicting an example of schematic configuration of a vehicle control system.

FIG. 16 is a diagram of assistance in explaining an example of installation positions of an outside-vehicle information detecting section and an imaging section.

FIG. 17 is a view depicting an example of a schematic configuration of an endoscopic surgery system.

FIG. 18 is a block diagram depicting an example of a functional configuration of a camera head and a camera control unit (CCU).

MODES FOR CARRYING OUT THE INVENTION

In the following, an embodiment of the present disclosure is described in detail with reference to the drawings. Note that the description is given in the following order.
1. Embodiment (solid-state imaging device) . . . FIGS. 1 to 10
2. Modifications (solid-state imaging device) . . . FIGS. 11 and 12
3. Application Example
An example where the imaging device according to any of the embodiment and the modifications thereof described above is applied to an imaging system . . . FIGS. 13 and 14
4. Practical Application Examples
Practical Application Example 1 . . . An example where the imaging device according to any of the embodiment and the modifications thereof described above is applied to a mobile body . . . FIGS. 15 and 16
Practical Application Example 2 . . . An example where the imaging device according to any of the embodiment and the modifications thereof described above is applied to a surgical system . . . FIGS. 17 and 18

1. Embodiment

Configuration

A solid-state imaging device 1 according to an embodiment of the present disclosure is described. The solid-state imaging device 1 is, for example, a back-illuminated image sensor of a global shutter method that includes a CMOS (Complementary Metal Oxide Semiconductor) image sensor or the like. The solid-state imaging device 1 receives light from a subject, performs photoelectric conversion on the light, and generates an image signal to thereby capture an image. The solid-state imaging device 1 outputs a pixel signal based on entering light.

The global shutter method is a method of performing global exposure in which exposure is basically started at the same time for all pixels and the exposure is terminated at the same time for all pixels. Here, all pixels refer to all of the pixels in a part appearing in an image, which exclude dummy pixels and the like. Further, if a time difference, image distortion, or the like is enough small not to be an issue, a method of moving a region for performing global exposure while performing global exposure in a unit of two or more rows (e.g., several tens of rows) instead of performing it for all pixels at the same time is also included in the global shutter method. In addition, a method of performing global exposure for not all of the pixels in the part appearing in the image but for pixels in a predetermined region is also included in the global shutter method.

The back-illuminated image sensor is an image sensor having a configuration in which a photoelectric converter is provided between a light receiving surface which light from a subject enters and a wiring layer in which a wiring of a transistor or the like driving each pixel is provided. The photoelectric converter is a photodiode or the like that receives light from the subject and converts it into an electric signal. Note that the present disclosure is not limitedly applied to a CMOS image sensor.

FIG. 1 illustrates an example of a schematic configuration of the solid-state imaging device 1 according to the embodiment of the present disclosure. The solid-state imaging device 1 includes a pixel array section 10 in which two or more sensor pixels 11 performing photoelectric conversion are arranged in a matrix. The sensor pixel 11 corresponds to one specific example of a "pixel" of the present disclosure. FIG. 2 illustrates an example of a circuit configuration of the sensor pixels 11 and a read circuit 12 (which will be described later). FIG. 3 illustrates an example of a cross-sectional configuration of the sensor pixels 11 and the read circuit 12. The solid-state imaging device 1 includes, for example, two substrates (a first substrate 30 and a second substrate 40) that are bonded to each other.

The first substrate 30 includes two or more sensor pixels 11 on a semiconductor substrate 31. The two or more sensor pixels 11 are provided in a matrix at positions opposing a back surface (a light receiving surface 31A) of the semiconductor substrate 31. The first substrate 30 further includes two or more read circuits 12 on the semiconductor substrate 31. Note that the read circuits 12 are not illustrated in FIG. 3. The read circuits 12 each output a pixel signal based on electric charge supplied from the sensor pixel 11. The two or more read circuits 12 are each provided, for example, for every four sensor pixels 11. In this case, the four sensor pixels 11 share one read circuit 12. Here, "share" refers to that the output from the four sensor pixels 11 is supplied to the common read circuit 12. The read circuit 12 includes, for example, a reset transistor RST, a selection transistor SEL, and an amplification transistor AMP.

The first substrate 30 includes two or more pixel driving lines extending in a row direction, and two or more data output lines VSL extending in a column direction. The pixel driving line is a wiring line to which a control signal controlling the output of electric charge accumulated in the sensor pixel 11 is applied. The data output line VSL is a wiring line for supplying a pixel signal supplied from each of the read circuits 12 to a logic circuit 20.

The second substrate 40 includes the logic circuit 20 on a semiconductor substrate 41. The logic circuit 20 processes a pixel signal. The logic circuit 20 includes, for example, a vertical drive circuit 21, a column signal processing circuit 22, a horizontal drive circuit 23, and a system control circuit 24. The logic circuit 20 outputs an output voltage for each of the sensor pixels 11 to outside.

The vertical drive circuit 21 selects, for example, the two or more sensor pixels 11 sequentially for each predetermined unit pixel row. The "predetermined unit pixel row" refers to pixel rows whose pixels are selectable by the same address. For example, in a case where two or more sensor pixels 11 share a single read circuit 12 and where the two or more sensor pixels 11 sharing the read circuit 12 have a layout of two pixel rows×n-pixel columns (n is an integer of 1 or greater), the "predetermined unit pixel row" refers to two pixel rows. Similarly, in a case where the two or more sensor pixels 11 sharing the read circuit 12 have a layout of four pixel rows×n-pixel columns (n is an integer of 1 or greater), the "predetermined unit pixel row" refers to four pixel rows.

The column signal processing circuit 22 performs a correlated double sampling (Correlated Double Sampling: CDS) process, for example, on a pixel signal supplied from each of the sensor pixels 11 in a row selected by the vertical drive circuit 21. The column signal processing circuit 22 extracts a signal level of the pixel signal, for example, by performing the CDS process and holds pixel data based on the amount of received light of each of the sensor pixels 11. The column signal processing circuit 22 includes, for example, a column signal processor for each of the data output lines VSL. The column signal processor includes, for example, a single-slope A/D converter. The single-slope A/D converter includes, for example, a comparator and a counter circuit. The horizontal drive circuit 23 sequentially outputs, for example, the pieces of pixel data held in the column signal processing circuit 22 to outside. The system control circuit 24 controls, for example, driving of the respective blocks (the vertical drive circuit 21, the column signal processing circuit 22, and the horizontal drive circuit 23) in the logic circuit 20.

The sensor pixels 11 have the same components as each other. The sensor pixels 11 each include, for example, a photodiode PD, a first transfer transistor TRX, a second transfer transistor TRM, a charge holding section MEM, a third transfer transistor TRG, a floating diffusion FD, and a discharge transistor OFG. The first transfer transistor TRX, the second transfer transistor TRM, the third transfer transistor TRG, and the discharge transistor OFG are, for example, NMOS (Metal Oxide Semiconductor) transistors. The photodiode PD corresponds to one specific example of a "photoelectric converter" of the present disclosure. The first transfer transistor TRX corresponds to one specific example of a "transfer transistor" of the present disclosure.

The photodiode PD performs photoelectric conversion on light L entering via the light receiving surface 31A. The photodiode PD generates electric charge based on the amount of received light by performing the photoelectric conversion. The photodiode PD includes, for example, an N-type semiconductor region 32A and an N-type semiconductor region 32B provided in the semiconductor substrate 31. The N-type semiconductor region 32A is provided closer to the light receiving surface 31A than the N-type semiconductor region 32B. The light entering the light receiving surface 31A is subjected to photoelectric conversion in the N-type semiconductor region 32A and electric charge is generated. Thereafter, the electric charge is accumulated in the N-type semiconductor region 32B. Note that a boundary between the N-type semiconductor region 32A and the N-type semiconductor region 32B is not necessarily clear. For example, it is sufficient that the N-type impurity concentration gradually increases from the N-type semiconductor region 32A toward the N-type semiconductor region 32B. A cathode of the photodiode PD is electrically coupled to a source of the first transfer transistor TRX, and an anode of the photodiode PD is electrically coupled to a reference potential line (e.g., a ground GND).

The first transfer transistor TRX is coupled between the photodiode PD and the second transfer transistor TRM. The first transfer transistor TRX transfers the electric charge accumulated in the photodiode PD to the second transfer transistor TRM in accordance with a control signal applied to a gate electrode (a vertical gate electrode VG). The first transfer transistor TRX transfers electric charge from the photodiode PD to the charge holding section MEM. The first transfer transistor TRX includes the vertical gate electrode VG. A drain of the first transfer transistor TRX is electrically coupled to a source of the second transfer transistor TRM, and a gate of the first transfer transistor TRX is coupled to the pixel driving line.

The second transfer transistor TRM is coupled between the first transfer transistor TRX and the third transfer transistor TRG. The second transfer transistor TRM controls a potential of the charge holding section MEM in accordance with a control signal applied to the gate electrode. For example, when the second transfer transistor TRM is turned on, the potential of the charge holding section MEM becomes deep, and when the second transfer transistor TRM is turned off, the potential of the charge holding section MEM becomes shallow. Further, for example, when the first transfer transistor TRX and the second transfer transistor TRM are turned on, electric charge accumulated in the photodiode PD is transferred to the charge holding section MEM via the first transfer transistor TRX and the second transfer transistor TRM. A drain of the second transfer transistor TRM is electrically coupled to a source of the third transfer transistor TRG, and a gate of the second transfer transistor TRM is coupled to the pixel driving line.

The charge holding section MEM is a region that temporarily holds electric charge accumulated in the photodiode PD to achieve a global shutter function. The charge holding section MEM holds electric charge transferred from the photodiode PD.

The third transfer transistor TRG is coupled between the second transfer transistor TRM and the floating diffusion FD. The third transfer transistor TRG transfers electric charge held in the charge holding section MEM to the floating diffusion FD in accordance with a control signal applied to the gate electrode. For example, when the second transfer transistor TRM is turned off and the third transfer transistor TRG is turned on, the electric charge held in the charge holding section MEM is transferred to the floating diffusion FD via the second transfer transistor TRM and the third transfer transistor TRG. A drain of the third transfer transistor TRG is electrically coupled to the floating diffusion FD, and a gate of the third transfer transistor TRG is coupled to the pixel driving line.

The floating diffusion FD is a floating diffusion region that temporarily holds electric charge supplied from the photodiode PD via the third transfer transistor TRG. For example, the reset transistor RST is coupled to the floating diffusion FD, and the vertical signal line VSL is also coupled to the floating diffusion FD via the amplification transistor AMP and the selection transistor SEL.

Regarding the discharge transistor OFG, a drain is coupled to a power supply line VDD, and a source is coupled between the first transfer transistor TRX and the second transfer transistor TRM. The discharge transistor OFG initializes (resets) the photodiode PD in accordance with a control signal applied to the gate electrode. For example, when the first transfer transistor TRX and the discharge transistor OFG are turned on, the potential of the photodiode PD is reset to a potential level of the power supply line VDD. That is, initialization of the photodiode PD is performed. Further, the discharge transistor OFG forms an overflow path, for example, between the first transfer transistor TRX and the power supply line VDD, and discharges the electric charge overflowing from the photodiode PD to the power supply line VDD.

Regarding the reset transistor RST, a drain is coupled to the power supply line VDD, and a source is coupled to the floating diffusion FD. The reset transistor RST initializes (resets) the respective regions from the charge holding section MEM to the floating diffusion FD in accordance with a control signal applied to the gate electrode. For example, when the third transfer transistor TRG and the reset transistor RST are turned on, the potentials of the charge holding section MEM and the floating diffusion FD are reset to the potential level of the power supply line VDD. That is, initialization of the charge holding section MEM and the floating diffusion FD is performed.

The amplification transistor AMP has a gate electrode coupled to the floating diffusion FD, and a drain coupled to the power supply line VDD. The amplification transistor AMP serves as an input section of a source follower circuit that reads electric charge obtained by photoelectric conversion in the photodiode PD. That is, the amplification transistor AMP has a source coupled to the vertical signal line VSL via the selection transistor SEL, thereby providing the source follower circuit together with a constant current source coupled to one end of the vertical signal line VSL.

The selection transistor SEL is coupled between the source of the amplification transistor AMP and the vertical signal line VSL. A control signal is supplied as a selection signal to a gate electrode of the selection transistor SEL. When the control signal is turned on, the selection transistor SEL is brought to a conductive state, and the sensor pixel 11 coupled to the selection transistor SEL is brought into a selected state. When the sensor pixel 11 is brought into the selected state, a pixel signal outputted from the amplification transistor AMP is read by the column signal processing circuit 22 via the vertical signal line VSL.

Next, referring to FIGS. 3 to 7, a configuration of the sensor pixel 11 is described in detail. FIG. 4 is a perspective view of an example of a schematic configuration of the sensor pixel 11. FIG. 5 illustrates an example of a planar configuration at Sec1 in FIG. 4. FIG. 6 illustrates an example of a planar configuration at Sec2 in FIG. 4. FIG. 7 illustrates an example of a planar configuration at Sec3 in FIG. 4. Note that, in FIG. 5, a layout of various transistors (the reset transistor RST, the amplification transistor AMP, and the selection transistor SEL) included in the read circuit 12, the layout of the metal embedded sections 34A and 36A which will be described later, etc. are superimposed on the planar configuration at Sec1 in FIG. 4. Further, FIG. 5 illustrates, as an example, a case where the four floating diffusions FD sharing the read circuit 12 are electrically coupled to a common extraction electrode 13. Further, in FIG. 6, the layout of the metal embedded sections 34A and 36B which will be described later is superimposed on the planar configuration at Sec2 in FIG. 4.

The first substrate 30 includes an insulating layer 32 stacked on the semiconductor substrate 31. That is, the insulating layer 32 is provided in contact with an upper surface of the semiconductor substrate 31. The first transfer transistor TRX, the second transfer transistor TRM, the charge holding section MEM, the third transfer transistor TRG, the floating diffusion FD, and the discharge transistor OFG are provided on the upper surface of the semiconductor substrate 31. The charge holding section MEM is provided in the vicinity of the upper surface of the semiconductor substrate 31. Therefore, the upper surface of the semiconductor substrate 31 serves as a formation surface 31B for the first transfer transistor TRX or the like.

The gate electrodes of the first transfer transistor TRX, the second transfer transistor TRM, the third transfer transistor TRG, and the discharge transistor OFG, the wiring lines coupled to these gate electrodes, and the like are provided in the insulating layer 32. The gate electrodes of the first transfer transistor TRX, the second transfer transistor TRM, the third transfer transistor TRG, and the discharge transistor OFG, the wiring lines coupled to these gate electrodes, and the like include, for example, a metal material. The gate electrode (the vertical gate electrode VG) of the first transfer transistor TRX may include polysilicon.

The semiconductor substrates 31 and 41 include, for example, silicon substrates. The semiconductor substrate 31 includes, for example, a silicon (111) substrate. The silicon (111) substrate is a single-crystal silicon substrate having (111) crystal orientation. The semiconductor substrate 31 includes the N-type semiconductor region 32B at a portion of the upper surface (the formation surface 31B) and in the vicinity thereof, and includes the N-type semiconductor region 32A in a region deeper than the N-type semiconductor region 32B. The semiconductor substrate 31 further includes the floating diffusion FD and the charge holding section MEM. The gate electrode (the vertical gate electrode VG) of the first transfer transistor TRX is provided to extend from the upper surface (the formation surface 31B) of the semiconductor substrate 31 in a thickness direction (a normal direction) of the semiconductor substrate 31. The gate electrode (the vertical gate electrode VG) of the first transfer transistor TRX extends from the formation surface 31B to a depth reaching the N-type semiconductor region 32A (the photodiode PD). The gate electrode (the vertical gate electrode VG) of the first transfer transistor TRX has, for example, a rod-like shape extending in the thickness direction (the normal direction) of the semiconductor substrate 31.

The first substrate 30 further includes, for example, a fixed charge film 38 that is in contact with the back surface (the light receiving surface 31A) of the semiconductor substrate 31. The fixed charge film 38 has negative fixed charge in order to suppress generation of a dark current due to the interface state on the light receiving surface 31A side of the semiconductor substrate 31. The fixed charge film 38 includes, for example, an insulating film having negative fixed charge. A material of such an insulating film is, for example, a hafnium oxide, a zircon oxide, an aluminum oxide, a titanium oxide, or a tantalum oxide. An electric field induced by the fixed charge film 38 provides a hole accumulation layer at the interface on the light receiving surface 31A side of the semiconductor substrate 31. This hole accumulation layer suppresses generation of electrons from the interface. The first substrate 30 further includes, for example, a color filter 39. The color filter 39 is provided on the light receiving surface 31A side of the semiconductor substrate 31. The color filter 39 is provided, for example, in contact with the fixed charge film 38, and is provided at a position opposing the sensor pixel 11 with the fixed charge film 38 interposed therebetween.

The sensor pixels 11 each have a light receiving lens 50 on the back surface (the light receiving surface 31A) side of the semiconductor substrate 31. That is, the solid-state imaging device 1 includes two or more light receiving lenses 50 provided for the sensor pixels 11 on a one-to-one basis. The two or more light receiving lenses 50 are provided for the photodiodes PD on a one-to-one basis, and are disposed at respective positions opposing the photodiodes PD. That is, the solid-state imaging device 1 is a back-illuminated imaging device. The light receiving lens 50 is provided, for example, in contact with the color filter 39, and is provided at a position opposing the sensor pixel 11 with the color filter 39 and the fixed charge film 38 interposed therebetween.

The first substrate 30 includes device separators 34 and 36 which electrically and optically separate two adjacent sensor pixels 11 from each other. The device separators 34 and 36 are provided to extend in the normal direction (the thickness direction) of the semiconductor substrate 31. The device separators 34 and 36 are stacked in the normal direction (the thickness direction) of the semiconductor substrate 31 inside the semiconductor substrate 31. That is, the device separators 34 and 36 are joined to each other. A structure including the device separators 34 and 36 is provided to extend from the light receiving surface 31A to the formation surface 31B. That is, the structure including the device separators 34 and 36 runs through the semiconductor substrate 31 and the semiconductor layer 33.

The device separator 34 is provided in such a manner as to surround the sensor pixel 11 (in particular, the photodiode PD) in a horizontal in-plane direction, and is further provided to extend in the normal direction (the thickness direction) of the semiconductor substrate 31. The device separator 34 is provided between two photodiodes PD adjacent to each other. The device separator 34 includes, for example, the metal embedded section 34A and a P-type semiconductor section 34B.

The metal embedded section 34A and the P-type semiconductor section 34B both surround the sensor pixel 11 (in particular, the photodiode PD) in the horizontal in-plane direction, and extend in the normal direction (the thickness direction) of the semiconductor substrate 31. The P-type semiconductor section 34B is provided in contact with a side surface of the metal embedded section 34A, and is provided between the metal embedded section 34A and the photodiode PD. The metal embedded section 34A is formed, for example, by CVD (Chemical Vapor Deposition). The metal embedded section 34A includes, for example, aluminum or an aluminum alloy. The P-type semiconductor section 34B includes a semiconductor having a conductivity type of P-type.

The device separator 36 is provided in such a manner as to surround the sensor pixel 11 (in particular, the first transfer transistor TRX, the second transfer transistor TRM, the charge holding section MEM, the third transfer transistor TRG, the floating diffusion FD, and the discharge transistor OFG) in the horizontal in-plane direction, and is further provided to extend in the normal direction (the thickness direction) of the semiconductor substrate 31. The device separator 36 is provided at a position opposing the device separator 34 in the normal direction (the thickness direction) of the semiconductor substrate 31. The device separator 36 includes, for example, the metal embedded section 36A and the insulating film 36B.

The metal embedded section 36A and the insulating film 36B both surround the sensor pixel 11 (in particular, the first transfer transistor TRX, the second transfer transistor TRM, the charge holding section MEM, the third transfer transistor TRG, the floating diffusion FD, and the discharge transistor OFG) in the horizontal in-plane direction, and extend in the normal direction (the thickness direction) of the semiconductor substrate 31. The insulating film 36B is provided in contact with the side surface of the metal embedded section 36A, and is provided between the metal embedded section 36A and the sensor pixel 11. The metal embedded section 36A is formed, for example, by CVD. The metal embedded section 36A includes, for example, aluminum or an aluminum alloy. The insulating film 36B is, for example, an oxide film formed by thermally oxidizing the semiconductor substrate 31, and includes, for example, a silicon oxide.

An upper part of the device separator 34 and a lower part of the device separator 36 are joined to each other in the normal direction (the thickness direction) of the semiconductor substrate 31. A complex including the device separator 34 and the device separator 36 corresponds to one specific example of a "separator" of the present disclosure. The complex including the device separator 34 and the device separator 36 electrically and optically isolates the respective sensor pixels 11. The complex including the device separator 34 and the device separator 36 is provided to extend from the light receiving surface 31A to the formation surface 31B. That is, the complex including the device separator 34 and the device separator 36 runs through the semiconductor substrate 31.

The first substrate 30 further includes a light blocking section 37 provided to extend in a layer between the photodiode PD and the charge holding section MEM. The light blocking section 37 blocks entry, into the charge holding section MEM, of light entering via the light receiving surface 31A. The light blocking section 37 includes, for example, the metal embedded section 37A and the insulating film 37B. The insulating film 37B is provided in contact with an upper surface, a lower surface, and a side surface of the metal embedded section 37A, and is so provided as to cover the metal embedded section 37A.

The metal embedded section 37A is formed, for example, by CVD. The metal embedded section 37A includes, for example, aluminum or an aluminum alloy. The insulating film 37B is, for example, an oxide film formed by thermally oxidizing the semiconductor substrate 31, and includes, for example, a silicon oxide. The insulating film 37B may include a multilayer film including a $SiO_2$ film (a silicon oxide film). The insulating film 37B may have, for example, a stacked structure including a $SiO_2$ film (a silicon oxide film), a SCF film, and another $SiO_2$ film (a silicon oxide film). The SCF film includes, for example, a hafnium oxide, a zircon oxide, an aluminum oxide, a titanium oxide, a tantalum oxide, or the like. The insulating film 37B may be a single-layer film including $SiO_2$ (silicon oxide). The metal embedded section 37A corresponds to one specific example of a "light blocking section" of the present disclosure. The insulating film 37B corresponds to one specific example of a "charge blocking section" of the present disclosure.

The metal embedded section 37A is provided in contact with the upper part of the metal embedded section 34A of the device separator 34. The metal embedded section 37A blocks entry, into the charge holding section MEM, of light entering via the back surface (the light receiving surface 31A) of the semiconductor substrate 31. The metal embedded section 37A is disposed in a layer between the photodiode PD and the charge holding section MEM. The metal embedded section 37A is a sheet-shaped metal layer that extends in the normal direction (the thickness direction) of the semiconductor substrate 31. The metal embedded section 37A is provided in contact with the upper part of the metal embedded section 34A of the device separator 34 and the lower part of the metal embedded section 36A of the device separator 36. The insulating film 37B is provided in contact with the insulating film 36B of the device separator 36. That is, the device separators 34 and 36 are joined to the light blocking section 37.

The metal embedded section 37A has an opening 37H through which the vertical gate electrode VG runs. That is, the metal embedded section 37A blocks entry, into the charge holding section MEM, of the light entering via the back surface (the light receiving surface 31A) of the semiconductor substrate 31, at a part other than the opening 37H. A portion of the semiconductor substrate 31 (a semiconductor section 31C) is present in the opening 37H. The semiconductor section 31C serves as a transfer path for transferring electric charge to the first transfer transistor TRX. The insulating film 37B covers the metal embedded section 37A and isolates the metal embedded section 37A and the vertical gate electrode VG from each other. The metal embedded section 37A and the vertical gate electrode VG are both provided in contact with the insulating film 37B.

The insulating film 37B blocks transfer of electric charge to the first transfer transistor TRX via a region between an edge, of the opening 37H, closer to the charge holding section MEM and the vertical gate electrode VG. Accordingly, no transfer path for transferring electric charge to the first transfer transistor TRX is present in the region between the edge, of the opening 37H, closer to the charge holding section MEM (that is, an edge closer to the charge holding section MEM out of edges of the metal embedded section 37A) and the vertical gate electrode VG. In other words, no or little path allows the light entering via the light receiving surface 31A to enter the charge holding section MEM in the region between the edge, of the opening 37H, closer to the charge holding section MEM (that is, the edge closer to the charge holding section MEM out of the edges of the metal embedded section 37A) and the vertical gate electrode VG. Note that a transfer path for transferring electric charge to the first transfer transistor TRX is present in a region between an edge, of the opening 37H, far away from the charge holding section MEM (that is, an edge far away from the charge holding section MEM out of the edges of the metal embedded section 37A) and the vertical gate electrode VG.

Manufacturing Method

Next, a method of manufacturing the solid-state imaging device 1 is described. FIGS. 8A to 8L illustrate an example of a process of manufacturing the solid-state imaging device 1.

First, prepared is the semiconductor substrate 31 on which the photodiode PD, the P-type semiconductor section 34B, the floating diffusion FD, the charge holding section MEM, and the like are formed (FIG. 8A). Thereafter, a hard mask 110 selectively covering the formation surface 31B is formed on an upper surface (the formation surface 31B) of the semiconductor substrate 31 (FIG. 8A). The hard mask 110 has an opening H1 at a position to form the device separator 36. The hard mask 110 includes, for example, an insulating material such as SiN (silicon nitride) or $SiO_2$ (silicon oxide).

Thereafter, a portion, exposed from the opening H1, of Si (111) included in the semiconductor substrate 31 is dug down by dry etching with use of the hard mask 110, thereby providing a trench H2 at a position to form the device separator 36 (FIG. 8B). The depth of the trench H2 provided at this time corresponds to the dimension in the depth direction of the device separator 36 which will be formed later. Note that, upon performing wet etching on the semiconductor substrate 31 which will be described later, the etching process also proceeds slightly in the <111> direction. Therefore, it is favorable to adjust the depth of the trench H2 taking that into consideration.

Thereafter, a sidewall 33s is formed in such a manner as to cover a side surface of the trench H2 (FIG. 8C). Upon forming the sidewall 33s, for example, an insulating film including SiN, $SiO_2$, or the like is formed in such a manner as to cover an inner surface of the trench H2, i.e., a side surface and a bottom surface of the trench H2, following which only the insulating film covering the bottom surface of the trench H2 is removed by dry etchback. At this time, the hard mask 110 selectively covering the upper surface (the formation surface 31B) of the semiconductor substrate 31 is left without being removed by dry etchback. Therefore, it is favorable that a material included in the sidewall 33s be different from a material included in the hard mask 110.

Thereafter, Si (111) included in the semiconductor substrate 31 is partially removed by dry etchback in such a manner as to further dig down the bottom surface of the trench H2 (FIG. 8D). At that time, the bottom surface of the trench H2 is further dug down, for example, by a depth corresponding to the thickness of the light blocking section 37. The etching process proceeds slightly in the <111> direction also in this case upon performing wet etching on the semiconductor substrate 31 which will be described later. Therefore, it is favorable to adjust the digging depth from the bottom surface of the trench H2 taking that into consideration.

Thereafter, a predetermined alkaline aqueous solution is injected into the trench H2, and Si (111) included in the semiconductor substrate 31 is partially removed by performing wet etching (FIG. 8E). As the alkaline aqueous solution, KOH, NaOH, CsOH, or the like is applicable among inorganic solutions, and EDP (ethylenediamine pyrocatechol aqueous solution), $N_2H_4$ (hydrazine), $NH_4OH$ (ammonium hydroxide), TMAH (tetramethylammonium hydroxide), or the like is applicable among organic solutions.

Here, crystal anisotropic etching utilizing a property that the etching rate differs in accordance with the plane orientation of Si (111) is performed. Specifically, in the Si (111) substrate, the etching rate in the <110> direction is sufficiently high with respect to the etching rate in the <111> direction. Therefore, in the present embodiment, while etching proceeds in a predetermined direction (a first direction) parallel to the upper surface (the formation surface 31B) of the semiconductor substrate 31, etching hardly proceeds in a second direction that is parallel to the upper surface (the formation surface 31B) of the semiconductor substrate 31 and is perpendicular to the first direction, or in a third direction perpendicular to the upper surface (the formation surface 31B) of the semiconductor substrate 31. As a result, a cavity 51 communicating with the trench H2 is provided inside the semiconductor substrate 31 which is a Si (111) substrate (FIG. 8E). The cavity 51 is surrounded by crystal planes 31D, 31E, and 31F. At this time, the semiconductor section 31C is formed in the same layer as the cavity 51 in the semiconductor substrate 31.

After providing the cavity 51, the hard mask 110 and the sidewall 33s are removed, for example, by wet etching. Note that, in some cases, the hard mask 110 and the sidewall 33s can be removed by isotropic dry etching. In wet etching, it is favorable to use, for example, a chemical solution including HF (hydrofluoric acid) such as DHF (dilute hydrofluoric acid) or BHF (buffered hydrofluoric acid) in a case where the hard mask 110 and the like include $SiO_2$, and to use a chemical solution including hot phosphoric acid (hot phosphoric acid), HF, or the like in a case where the hard mask 110 and the like include SiN. Note that removal of the hard mask 110 and the sidewall 33s does not have to be performed.

Thereafter, the insulating film 37B is formed in such a manner as to cover the side surface of the trench H2, the inner surface of the cavity 51, and the upper surface (the formation surface 31B) of the semiconductor substrate 31. Further, an embedded section 35 is formed in such a manner as to fill in the trench H2 and the cavity 51 (FIG. 8F). Note that, in order to fill the cavity 51 without any gap, it is desirable that the width (the dimension in a direction parallel to the formation surface 31B) of the trench H2 be greater than the thickness (the dimension in a direction perpendicular to the formation surface 31B) of the cavity 51. Further, in a case where a metal material is used for the embedded section 35 at this stage, it is difficult to perform a subsequent process involving a high temperature. Therefore, it is favorable to temporarily fill in the trench H2 and the cavity 51 with the embedded section 35 including a material having relatively high heat resistance such as $SiO_2$, SiN, or polysilicon, and to replace it with a predetermined metal material after completing the subsequent process involving a high temperature, for example, after completing a step of forming the read circuit 12.

Thereafter, a trench H3 running through the semiconductor section 31C is provided in the semiconductor substrate 31 (FIG. 8G). At this time, the trench H3 is formed in such a manner that the insulating film 37B is exposed at the side surface of the trench H3. Further, the trench H3 is provided to a depth that allows the bottom surface of the trench H3 to reach the N-type semiconductor region 32A (the photodiode PD). As illustrated in FIG. 8G, the insulating film 37B may protrude at the side surface of the trench H3.

Thereafter, the vertical gate electrode VG is so formed as to fill in the trench H3 (FIG. 8H). At this time, the vertical gate electrode VG may include a metal material, or may be formed by poly silicon. Thereafter, the first transfer transistor TRX, the second transfer transistor TRM, the third transfer transistor TRG, and the discharge transistor OFG are formed, and the insulating layer 32 in which these are embedded is formed (FIG. 8I).

Thereafter, for example, a trench H4 is provided in the P-type semiconductor section 34B from the light receiving surface 31A side of the semiconductor substrate 31 by dry etching (FIG. 8J). At this time, the trench H4 is provided to a depth that allows the bottom surface of the trench H4 to reach the embedded section 35. Thereafter, the embedded section 35 is removed by wet etching with use of a predetermined chemical solution. As a result, a cavity 53 is provided at a position where the embedded section 35 has been removed (FIG. 8K). The cavity 53 extends in an in-plane direction of the stack, and joins to the trench H4. As a chemical solution at this time, for example, hydrofluoric acid is used. Here, the insulating film 37B is left without being etched. Therefore, the insulating film 37B remains between the vertical gate electrode VG and the cavity 53.

Thereafter, for example, the metal embedded sections 34A, 36A, and 37A are formed by CVD in such a manner as to fill in the trench H4 and the cavity 53 (FIG. 8L). Thereafter, the surface is planarized by surface polishing by means of CMP. Thereafter, the second substrate 40 is bonded to the light receiving surface 31A of the semiconductor substrate 31, and the light receiving lens 50 is bonded to the light receiving surface 31A. Thus, the solid-state imaging device 1 according to the present embodiment is manufactured.

Effects

Next, effects of the solid-state imaging device 1 according to the present embodiment are described in comparison with a comparative example.

FIG. 9 illustrates an example of a cross-sectional configuration of pixels of a solid-state imaging device 100 according to the comparative example. FIG. 10 is a perspective view of an example of a schematic configuration of a pixel of the solid-state imaging device 100. The solid-state imaging device 100 is the solid-state imaging device described in PTL 1 described above, and has a configuration in which a light blocking section 370 is provided instead of the light blocking section 37 in the solid-state imaging device 1.

The light blocking section 370 includes a metal layer 370A and an insulating film 370B. The metal layer 370A extends in an in-plane direction of the first substrate 30. The insulating film 370B has a lot of upper surfaces, bottom surfaces, and side surfaces of the metal layer 370A. As with the semiconductor section 31C of the solid-state imaging device 1, a part (a semiconductor section 310C) provided in an opening 370H of the light blocking section 370 serves as a transfer path of electric charge. Unlike the semiconductor section 31C, the semiconductor section 310C of a mesa type is formed before the metal layer 370A is formed. Thus, in the solid-state imaging device 100, the transfer path of electric charge is formed, the metal layer 370A is thereafter formed around the mesa-type semiconductor section 310C, and the vertical gate electrode VG running through the mesa-type semiconductor section 310C is thereafter formed. Therefore, a large-sized transfer path for electric charge is formed between the metal layer 370A and the vertical gate electrode VG. However, because of such a configuration, it is easy for light L entering via the light receiving surface 31A to enter the charge holding section via the semiconductor section 310C. As a result, noise is generated due to entry of light into the charge holding section.

In contrast, in the present embodiment, the insulating film 37B is provided between the edge, of the metal embedded section 37A, closer to the charge holding section MEM and the vertical gate electrode VG. Thus, the insulating film 37B blocks transfer of electric charge to the transfer transistor via a region between the edge, of the metal embedded section 37A, closer to the charge holding section MEM and the vertical gate electrode VG. As a result, it is possible to reduce entry of light into the charge holding section MEM, as compared with the case where no insulating film 37B is provided in the opening 37H of the metal embedded section 37A. Therefore, it is possible to reduce noise due to entry of light into the charge holding section MEM.

Further, in the present embodiment, the insulating film 37B isolates the metal embedded section 37A and the vertical gate electrode VG from each other. Thus, with the insulating film 37B, it is possible to reduce entry of light into the charge holding section MEM while isolating the metal embedded section 37A and the vertical gate electrode VG from each other.

Further, in the present embodiment, the metal embedded section 37A and the vertical gate electrode VG are both provided in contact with the insulating film 37B. Thus, with the insulating film 37B, it is possible to reduce entry of light into the charge holding section MEM while isolating the metal embedded section 37A and the vertical gate electrode VG from each other.

Further, in the present embodiment, the insulating film 37B includes a single-layer film including a silicon oxide or a multilayer film including a silicon oxide film. Thus, with the insulating film 37B, it is possible to reduce entry of light into the charge holding section MEM while isolating the metal embedded section 37A and the vertical gate electrode VG from each other.

Further, in the present embodiment, the metal embedded sections 34A and 36A electrically and optically separating the sensor pixels 11 from each other are joined to the metal embedded section 37A. Thus, as compared with the case where the metal embedded sections 34A and 36A are provided away from the metal embedded section 37A, it is possible to reduce entry of light into the charge holding section MEM. Therefore, it is possible to reduce noise due to entry of light into the charge holding section MEM.

Further, in the present embodiment, the complex including the metal embedded sections 34A and 36A is provided to extend from the light receiving surface 31A to the formation surface 31B. Thus, it is possible to reduce entry of light into the charge holding section MEM, as compared with a case where the complex including the metal embedded sections 34A and 36A is provided only in a portion in the layer between the light receiving surface 31A and the formation surface 31B. Therefore, it is possible to reduce noise due to entry of light into the charge holding section MEM.

2. Modifications

In the following, modifications of the solid-state imaging device 1 according to the above-described embodiment are described.

In the above-described embodiment, the vertical gate electrode VG has a rod-like shape. However, in the above-described embodiment, for example, the vertical gate electrode VG may include walls VGa and Vgb that block entry, into the charge holding section MEM, of light entering via the light receiving surface 31A, as illustrated in FIG. 11. The wall VGa and the wall VGb are disposed along an end, of the opening 37H of the metal embedded section 37A, closer to the charge holding section MEM. In such a case, with the walls VGa and Vgb, it is possible to block entry, into the charge holding section MEM, of light entering via the light receiving surface 31A. Therefore, it is possible to reduce noise due to entry of light into the charge holding section MEM.

Further, in the above-described embodiment, the vertical gate electrode VG may include the wall VGa blocking entry, into the charge holding section MEM, of light entering via the light receiving surface 31A, for example, as illustrated in FIG. 12. The wall VGa is disposed along an end, of the opening 37H of the metal embedded section 37A, closer to the charge holding section MEM. It is possible to block entry, into the charge holding section MEM, of light entering via the light receiving surface 31A with the wall VGa also in such a case. Therefore, it is possible to reduce noise due to entry of light into the charge holding section MEM.

3. Application Examples

FIG. 13 illustrates an example of a schematic configuration of an imaging system 2 including the solid-state imaging device 1 according to any of the embodiment and the modifications thereof described above. The imaging system 2 corresponds to one specific example of an "electronic apparatus" of the present disclosure.

The imaging system 2 is, for example, an imaging apparatus, an electronic apparatus, or the like. Examples of the imaging apparatus include a digital still camera and a video camera. Examples of the electronic apparatus include a portable terminal device such as a smartphone or a tablet terminal. The imaging system 2 includes, for example, the solid-state imaging device 1 according to any of the embodiment and the modifications thereof described above, an optical system 141, a shutter device 142, a control circuit 143, a DSP circuit 144, a frame memory 145, a display section 146, a storage section 147, an operation section 148, and a power supply section 149. In the imaging system 2, the solid-state imaging device 1 according to any of the embodiment and the modifications thereof described above, the DSP circuit 144, the frame memory 145, the display section 146, the storage section 147, the operation section 148, and the power supply section 149 are coupled to each other via a bus line 150.

The optical system 141 includes one or more lenses. The optical system 141 guides light (entering light) from the subject to the solid-state imaging device 1 to form an image on the light receiving surface of the solid-state imaging device 1. The shutter device 142 is disposed between the optical system 141 and the solid-state imaging device 1. The shutter device 142 controls a period of applying light to the solid-state imaging device 1 and a period of blocking the light in accordance with a control by the control circuit 143. The solid-state imaging device 1 accumulates signal electric charge for a certain period in accordance with light of an image formed on the light receiving surface via the optical system 141 and the shutter device 142. The signal electric charge accumulated in the solid-state imaging device 1 is transferred, as a pixel signal (image data), to the DSP circuit 144 in accordance with a drive signal (a timing signal) supplied from the control circuit 143. That is, the solid-state imaging device 1 receives image light (entering light) entering via the optical system 141 and the shutter device 142, and supplies a pixel signal based on the received image light (entering light) to the DSP circuit 144. The control circuit 143 outputs a drive signal that controls transfer operation of the solid-state imaging device 1 and shutter operation of the shutter device 142 to thereby drive the solid-state imaging device 1 and the shutter device 142.

The DSP circuit 144 is a signal processing circuit that processes the pixel signal (the image data) supplied from the solid-state imaging device 1. The frame memory 145 temporarily holds the image data processed by the DSP circuit 144 on a frame-unit basis. The display section 146 includes, for example, a panel-type display device such as a liquid crystal panel or an organic EL (Electro Luminescence) panel, and displays a moving image or a still image captured by the solid-state imaging device 1. The storage section 147 records image data of a moving image or a still image captured by the solid-state imaging device 1 in a recording medium such as a semiconductor memory or a hard disk. The operation section 148 issues an operation command for various functions of the imaging system 2 in accordance with operation performed by a user. The power supply section 149 supplies various power supplies serving as operation power supplies for the solid-state imaging device 1, the DSP circuit 144, the frame memory 145, the display section 146, the storage section 147, and the operation section 148 as appropriate for these supply targets.

Next, imaging procedure of the imaging system 2 is described.

FIG. 14 illustrates an example of a flowchart of imaging operation of the imaging system 2. A user instructs to start imaging by operating the operation section 148 (step S101). Then, the operation section 148 transmits an imaging command to the control circuit 143 (step S102). Upon receiving the imaging command, the control circuit 143 starts a control of the shutter device 142 and the solid-state imaging device 1. The solid-state imaging device 1 (specifically, the system control circuit 32d) executes imaging in a predetermined imaging method in accordance with a control performed by the control circuit 143 (step S103). The shutter device 142 controls the period of applying light to the solid-state imaging device 1 and the period of blocking the light in accordance with a control performed by the control circuit 143.

The solid-state imaging device 1 supplies image data obtained by imaging to the DSP circuit 144. Here, the image data is data for all of the pixels of the pixel signal generated on the basis of electric charge temporarily held in the floating diffusion FD. The DSP circuit 144 performs predetermined signal processing (e.g., a noise reduction process or the like) on the basis of the image data supplied from the solid-state imaging device 1 (step S104). The DSP circuit 144 causes the frame memory 145 to hold the image data subjected to the predetermined signal processing, and the frame memory 145 causes the storage section 147 to store the image data (step S105). Thus, the imaging by the imaging system 2 is performed.

In the present application example, the solid-state imaging device 1 according to any of the embodiment and the modifications thereof described above is applied to the imaging system 2. Thus, it is possible to reduce the size or increase definition of the solid-state imaging device 1. Therefore, it is possible to provide a small-sized or high-definition imaging system 2.

4. Practical Application Examples

Practical Application Example 1

The technology (the present technology) according to the present disclosure is applicable to a variety of products. For example, the technology according to the present disclosure may be achieved as a device mounted on any type of mobile body such as an automobile, an electric vehicle, a hybrid electric vehicle, a motorcycle, a bicycle, a personal mobility, an airplane, a drone, a vessel, or a robot.

FIG. 15 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 29, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 15, an audio speaker 12061, a display section 12062, and an instrument panel 12063 are illustrated as the output device. The display section 12062 may, for example, include at least one of an on-board display and a head-up display.

FIG. 16 is a diagram depicting an example of the installation position of the imaging section 12031.

In FIG. 16, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 16 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The above has described the example of the mobile body control system to which the technology according to the present disclosure is applicable. The technology according to the present disclosure is applicable to the imaging section 12031 among the above-described components. Specifically, the solid-state imaging device 1 according to any of the embodiment and the modifications thereof described above is applicable to the imaging section 12031. The application of the technology according to the present disclosure to the imaging section 12031 makes it possible to reduce the size or increase the definition of the imaging section 12031. It is therefore possible to provide a small-sized or high-definition mobile body control system.

Practical Application Example 2

FIG. 17 is a view depicting an example of a schematic configuration of an endoscopic surgery system to which the technology according to an embodiment of the present disclosure (present technology) can be applied.

In FIG. 17, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 18 is a block diagram depicting an example of a functional configuration of the camera head 11102 and the CCU 11201 depicted in FIG. 17.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

The above has described the example of the endoscopic surgery system to which the technology according to the present disclosure is applicable. The technology according to the present disclosure is favorably applicable to the image pickup unit 11402 provided to the camera head 11102 of the endoscope 11100 among the above-described components. The application of the technology according to the present disclosure to the image pickup unit 11402 makes it possible to reduce the size or increase the definition of the image pickup unit 11402. It is therefore possible to provide a small-sized or high-definition endoscope 11100.

Although the present disclosure has been described above with reference to the embodiment, the modifications thereof, the application example thereof, and the practical application examples thereof, the present disclosure is not limited to the above-described embodiment and the like, but may be modified in a variety of ways. It is to be noted that the effects described herein are merely illustrative. The effects of the present disclosure are not limited to the effects described herein. The present disclosure may have effects other than the effects described herein.

In addition, the present disclosure may also have the following configurations.

(1)
A solid-state imaging device including:
a light receiving surface; and
two or more pixels that oppose the light receiving surface, in which the pixels each include
a photoelectric converter that performs photoelectric conversion on light entering via the light receiving surface,
a charge holding section that holds electric charge transferred from the photoelectric converter,
a transfer transistor that includes a vertical gate electrode reaching the photoelectric converter, and transfers electric charge from the photoelectric converter to the charge holding section,
a light blocking section that is disposed in a layer between the photoelectric converter and the charge holding section and has an opening which the vertical gate electrode runs through, the light blocking section blocking entry, into the charge holding section, of light entering via the light receiving surface at a part other than the opening, and
a charge blocking section that blocks transfer of electric charge to the transfer transistor via a region between an edge, of the opening, closer to the charge holding section and the vertical gate electrode.

(2)
The solid-state imaging device according to (1), in which the charge blocking section isolates the light blocking section and the vertical gate electrode from each other.

(3)
The solid-state imaging device according to (1) or (2), in which the light blocking section and the vertical gate electrode are both provided in contact with the charge blocking section.

(4)
The solid-state imaging device according to any one of (1) to (3), in which the charge blocking section includes a single-layer film including a silicon oxide or a multilayer film including a silicon oxide film.

(5)
The solid-state imaging device according to any one of (1) to (4), in which the vertical gate electrode includes a wall that blocks entry, into the charge holding section, of light entering via the light receiving surface.

(6)
The solid-state imaging device according to any one of (1) to (5), further including a separator that is joined to each of the light blocking sections, the separator electrically and optically separating the pixels from each other.

(7)
The solid-state imaging device according to (6), further including
a semiconductor substrate that includes the light receiving surface and a formation surface for the transfer transistor, and on which each of the pixels is provided, in which the separator is provided to extend from the light receiving surface to the formation surface.

(8)
An electronic apparatus including:
a solid-state imaging device that outputs a pixel signal based on entering light; and
a signal processing circuit that processes the pixel signal, in which
the solid-state imaging device includes
a light receiving surface, and
two or more pixels that oppose the light receiving surface, and the pixels each include
a photoelectric converter that performs photoelectric conversion on light entering via the light receiving surface,
a charge holding section that holds electric charge transferred from the photoelectric converter,
a transfer transistor that includes a vertical gate electrode reaching the photoelectric converter, and transfers electric charge from the photoelectric converter to the charge holding section,
a light blocking section that is disposed in a layer between the photoelectric converter and the charge holding section and has an opening which the vertical gate electrode runs through, the light blocking section blocking entry, into the charge holding section, of light entering via the light receiving surface at a part other than the opening, and
a charge blocking section that blocks transfer of electric charge to the transfer transistor via a region between an edge, of the opening, closer to the charge holding section and the vertical gate electrode.

According to the solid-state imaging device and the electronic apparatus according to the embodiments of the present disclosure, as compared with the case where the charge blocking section is not provided at the opening of the light blocking section, it is possible to reduce entry of light into the charge holding section. It is therefore possible to reduce noise due to entry of light into the charge holding section. Note that the effects of the present technology are not necessarily limited to the effects described here, and may include any of the effects described herein.

This application claims the priority on the basis of Japanese Patent Application No. 2018-244508 filed on Dec. 27, 2018 with Japan Patent Office, the entire contents of which are incorporated in this application by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A solid-state imaging device comprising:
a light receiving surface; and
two or more pixels that oppose the light receiving surface, wherein
the pixels each include
a photoelectric converter that performs photoelectric conversion on light entering via the light receiving surface,
a charge holding section that holds electric charge transferred from the photoelectric converter,
a transfer transistor that includes a vertical gate electrode reaching the photoelectric converter, and transfers electric charge from the photoelectric converter to the charge holding section,
a light blocking section that is disposed in a layer between the photoelectric converter and the charge holding section and has an opening which the vertical gate runs through, the light blocking section blocking entry, into the charge holding section, of light entering via the light receiving surface at a part other than the opening, and a charge blocking section that blocks transfer of electric charge to the transfer transistor via a region between an edge, of the opening, closer to the charge holding section and the vertical gate.

2. The solid-state imaging device according to claim 1, wherein the charge blocking section isolates the light blocking section and the vertical gate from each other.

3. The solid-state imaging device according to claim 1, wherein the light blocking section and the vertical gate are both provided in contact with the charge blocking section.

4. The solid-state imaging device according to claim 2, wherein the charge blocking section includes a single-layer film including a silicon oxide or a multilayer film including a silicon oxide film.

5. The solid-state imaging device according to claim 1, wherein the vertical gate includes a wall that blocks entry, into the charge holding section, of light entering via the light receiving surface.

6. The solid-state imaging device according to claim 1, further comprising a separator that is joined to each of the light blocking sections, the separator electrically and optically separating the pixels from each other.

7. The solid-state imaging device according to claim 6, further comprising a semiconductor substrate that includes the light receiving surface and a formation surface for the transfer transistor, and on which each of the pixels is provided, wherein the separator is provided to extend from the light receiving surface to the formation surface.

8. An electronic apparatus comprising:

a solid-state imaging device that outputs a pixel signal based on entering light; and a signal processing circuit that processes the pixel signal, wherein the solid-state imaging device includes a light receiving surface, and two or more pixels that oppose the light receiving surface, and the pixels each include a photoelectric converter that performs photoelectric conversion on light entering via the light receiving surface, a charge holding section that holds electric charge transferred from the photoelectric converter, a transfer transistor that includes a vertical gate electrode reaching the photoelectric converter, and transfers electric charge from the photoelectric converter to the charge holding section, a light blocking section that is disposed in a layer between the photoelectric converter and the charge holding section and has an opening which the vertical gate runs through, the light blocking section blocking entry, into the charge holding section, of light entering via the light receiving surface at a part other than the opening, and a charge blocking section that blocks transfer of electric charge to the transfer transistor via a region between an edge, of the opening, closer to the charge holding section and the vertical gate.

* * * * *